United States Patent
Park

(10) Patent No.: US 7,977,724 B2
(45) Date of Patent: Jul. 12, 2011

(54) CAPACITOR AND METHOD OF MANUFACTURING THE SAME COMPRISING A STABILIZING MEMBER

(75) Inventor: Je-Min Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 236 days.

(21) Appl. No.: 11/876,591

(22) Filed: Oct. 22, 2007

(65) Prior Publication Data

US 2008/0042182 A1 Feb. 21, 2008

Related U.S. Application Data

(62) Division of application No. 11/116,999, filed on Apr. 27, 2005, now Pat. No. 7,300,841.

(30) Foreign Application Priority Data

Apr. 27, 2004 (KR) .................................. 2004-28889

(51) Int. Cl.
*H01L 27/108* (2006.01)
*H01L 29/94* (2006.01)

(52) U.S. Cl. ........ 257/306; 257/301; 257/302; 257/303; 257/304; 257/305; 257/307; 257/758; 257/E21.646; 257/E27.084; 257/E27.087

(58) Field of Classification Search .................. 257/306, 257/758, 301, 302, 303, 304, 305, 307, E27.084, 257/E21.646, E27.087

See application file for complete search history.

(56) References Cited

U.S. PATENT DOCUMENTS

| 6,667,502 | B1 * | 12/2003 | Agarwal et al. ............... 257/296 |
| 7,067,385 | B2 | 6/2006 | Manning |
| 2003/0085420 | A1 | 5/2003 | Ito et al. |
| 2003/0136996 | A1 | 7/2003 | Park et al. |
| 2003/0178728 | A1 * | 9/2003 | Park et al. ...................... 257/758 |
| 2003/0227044 | A1 | 12/2003 | Park |
| 2005/0051822 | A1 * | 3/2005 | Manning ....................... 257/296 |

FOREIGN PATENT DOCUMENTS

KR 2004-0000069 1/2004

OTHER PUBLICATIONS

English language abstract of Korean Publication No. 2004-0000069.

* cited by examiner

*Primary Examiner* — Matthew E Warren
*Assistant Examiner* — David Z Chen
(74) *Attorney, Agent, or Firm* — Mills & Onello, LLP

(57) ABSTRACT

A capacitor includes a cylindrical storage electrode formed on a substrate. A ring-shaped stabilizing member encloses an upper portion of the storage electrode to structurally support the storage electrode and an adjacent storage electrode. The ring-shaped stabilizing member is substantially perpendicular to the storage electrode and extends in a direction where the adjacent storage electrode is arranged. A dielectric layer is formed on the storage electrode. A plate electrode is formed on the dielectric layer.

5 Claims, 29 Drawing Sheets

CAPACITOR AND METHOD OF MANUFACTURING THE SAME COMPRISING A STABILIZING MEMBER

CROSS REFERENCE TO RELATED APPLICATION

This application is a Divisional of U.S. patent application Ser. No. 11/116,999, filed Apr. 27, 2005, now issued U.S. Pat. No. 7,300,841, which is claims priority from Korean Patent Application No. 10-2004-28889, filed on Apr. 27, 2004, the contents of which are incorporated herein by reference in their entirety.

BACKGROUND OF THE INVENTION

1. Field of the Invention

The invention relates to a semiconductor device and a method of manufacturing the semiconductor device. More particularly, the invention relates to a cylindrical capacitor that is used in a semiconductor memory device, and a method of manufacturing the capacitor.

2. Description of the Related Art

In general, semiconductor memory devices such as dynamic random access memory (DRAM) devices or static random access memory (SRAM) devices can store data or information therein. The data or information is stored in the semiconductor memory devices, and the data or information is also read out from the semiconductor memory devices. A typical single unit memory cell of the semiconductor memory device includes one capacitor and one transistor. The capacitor of the semiconductor memory device comprises a storage electrode, a dielectric layer, and a plate electrode. To improve a storage capacitance of the semiconductor memory device, the capacitor needs a large capacitance.

As the semiconductor memory device has been highly integrated, the area of the unit memory cell of the semiconductor memory device has been continuously reduced. To ensure a sufficient storage capacitance of the semiconductor memory device, the capacitor may have various shapes such as a box, a fin, a crown, a cylinder, etc. However, as a design rule, as the semiconductor memory device decreases in size, the capacitor should have a large aspect ratio, which is the ratio between the height and the width of the capacitor. A high aspect ratio is desirable because the capacitor having the sufficient capacitance is formed in a limited unit area of the semiconductor memory device. Capacitors having a high aspect ratio, however, may fall down so that a two-bit fail may occur between adjacent capacitors.

FIG. 1 is a cross sectional view illustrating a conventional capacitor having a cylindrical shape. A conventional capacitor includes a cylindrical storage electrode 13 connected to a contact pad 4 formed on a semiconductor substrate 1. The cylindrical storage electrode 13 is electrically connected to the contact pad 4 through a contact plug 10 formed in an insulation layer 7 that covers the semiconductor substrate 1. To increase the storage capacitance of the semiconductor memory device, the cylindrical storage electrode 13 of the capacitor has a greatly increased height. When the cylindrical storage electrode 13 has the greatly increased height, the cylindrical storage electrode 13 may fall down toward an adjacent cylindrical electrode 13 so that adjacent capacitors may make contact with each other. The fall of the cylindrical storage electrode 13 is referred to as a two-bit fail. When a two-bit fail occurs in the semiconductor memory device, the semiconductor memory device may not operate properly.

Accordingly, U.S. Patent Application Publication No. 2003-85420 discloses a semiconductor device including a beam-shaped insulating member between capacitors of the semiconductor device to improve the mechanical strength of the capacitor.

FIG. 2 is a cross-sectional view illustrating the semiconductor device including the beam-shaped insulating member, and FIG. 3 is a plan view illustrating the semiconductor device in FIG. 2.

Referring to FIGS. 2 and 3, after a semiconductor substrate 15 is divided into an active region and a field region by forming an isolation layer 18 on the semiconductor substrate 15, gate structures 27 are formed in the active region of the semiconductor substrate 15. Each of the gate structures 27 includes a gate oxide layer pattern, a gate electrode and a mask pattern.

Impurities are implanted into portions of the semiconductor substrate 15 by an ion implantation process using the gate structures 27 as masks, thereby forming source/drain regions 21 and 24 at the portions of the substrate 15 between the gate structures 27. Thus, metal oxide semiconductor (MOS) transistors are formed on the semiconductor substrate 15.

After a first insulating interlayer 42 is formed on the substrate 15 to cover the MOS transistors, capacitor plugs 30 and a bit line plug 33 are formed through the first insulating interlayer 42. The capacitor plugs 30 and the bit line plug 33 are connected to the source/drain regions 21 and 24, respectively.

After a second insulating interlayer 45 is formed on the first insulating interlayer 42, the second insulating interlayer 45 is partially etched to form a bit line contact plug 36 making contact with the bit line plug 45.

A third insulating interlayer 48 is formed on the second insulating interlayer 45. The third and second insulating interlayers 48 and 45 are successively etched to form capacitor contact plugs 39 contacting the capacitor plugs 30, respectively.

After an etch stop layer 51 is formed on the third insulating interlayer 48 and the capacitor contact plugs 39, holes 54 exposing the capacitor contact plugs 39 are formed through the etch stop layer 51. Cylindrical bottom electrodes 57 making contact with the capacitor contact plugs 39 are formed in the holes 54, respectively. Here, the cylindrical bottom electrodes 57 are electrically connected to the source/drain regions 21 and 24 through the capacitor contact plugs 39 and the capacitor plugs 30.

After beam-shaped insulating members 72 are formed between sidewalls of adjacent bottom electrodes 57, dielectric layers 60 and top electrodes 63 are successively formed on the bottom electrodes 57 to thereby form capacitors 66 on the semiconductor substrate 15.

An additional insulation layer 69 is formed over the substrate 15 to cover the capacitors 66. Since the beam-shaped insulating members 72 are formed between the sidewalls of the adjacent bottom electrodes 57, the mechanical strength of the capacitor 66 may be improved.

However, in the above-described semiconductor device, processes for manufacturing the semiconductor device may be complicated because at least four beam-shaped insulating members 72 are formed between the adjacent bottom electrodes 57 although the mechanical strength of the capacitor 66 may be improved through the beam-shaped insulating member 72. Thus, manufacturing cost and manufacturing time for the semiconductor device may be increased. Additionally, the manufacturing processes may be more complicated because the capacitor 66 has too complex structure including the bottom electrode 57, the beam-shaped insulating members 72, the dielectric layer 60 and the top electrode 63 as shown in FIGS. 2 and 3. Further, the additional insulation layer 69 may not be precisely formed between the capacitors 66 having the complex structure so that the capacitors 66 may be electrically connected to an upper wiring formed on the capacitors 66. As a result, the processes for manufacturing the semiconductor device including the capacitor 66 having the complex structure may have poor throughput.

SUMMARY OF THE INVENTION

The invention provides a capacitor having an improved structural stability and a method of forming the capacitor.

A capacitor in accordance with one aspect of the invention includes a cylindrical storage electrode formed on a substrate. A ring-shaped stabilizing member encloses an upper portion of the storage electrode to structurally support the storage electrode and an adjacent storage electrode. The ring-shaped stabilizing member is substantially perpendicular to the storage electrode and extends in a direction where the adjacent storage electrode is arranged. A dielectric layer is formed on the storage electrode. A plate electrode is formed on the dielectric layer.

In a method of manufacturing a capacitor in accordance with another aspect of the invention, a contact region is formed on a surface portion of a semiconductor substrate. A mold structure including a plurality of mold layers that have openings exposing the contact region is formed on the substrate. A cylindrical storage electrode is formed on inner sides of the openings. The mold structure is partially removed to form a ring-shaped stabilizing member enclosing an upper portion of the storage electrode. The ring-shaped stabilizing member is substantially perpendicular to the storage electrode and extends in a direction where the adjacent storage electrode is arranged to structurally support the storage electrode and an adjacent storage electrode. A dielectric layer is formed on the storage electrode. A plate electrode is then formed on the dielectric layer.

According to the invention, the storage electrode is connected to each other via the stabilizing member so that the two-bit fail may be avoided although the capacitor has a high aspect ratio. That is, since the stabilizing member supports the storage electrodes mutually, the capacitor may have improved structural stability without the capacitors falling down.

BRIEF DESCRIPTION OF THE DRAWINGS

The above and other features and advantages of the invention will become readily apparent by reference to the following detailed description when considered in conjunction with the accompanying drawings wherein.

DESCRIPTION OF THE PREFERRED EMBODIMENTS

Figure 1:
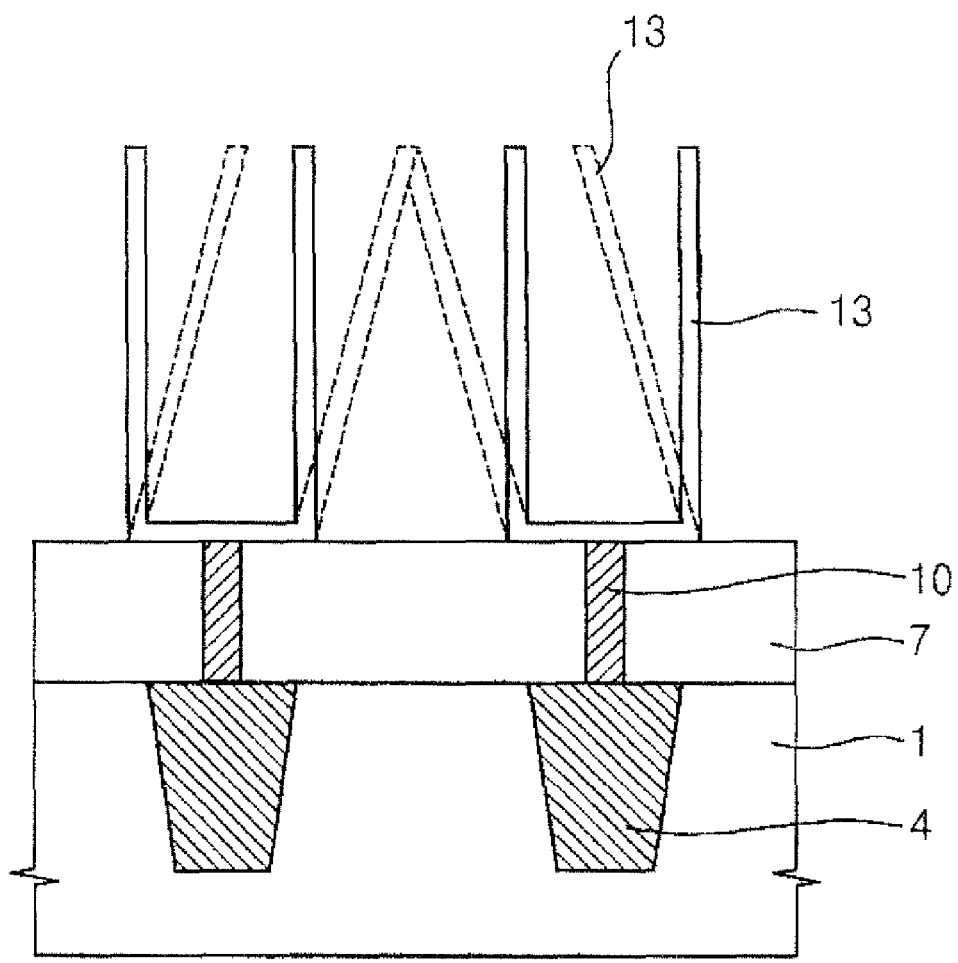
FIG. 1 is a cross sectional view illustrating a conventional capacitor having a cylindrical shape.
Figure 2:
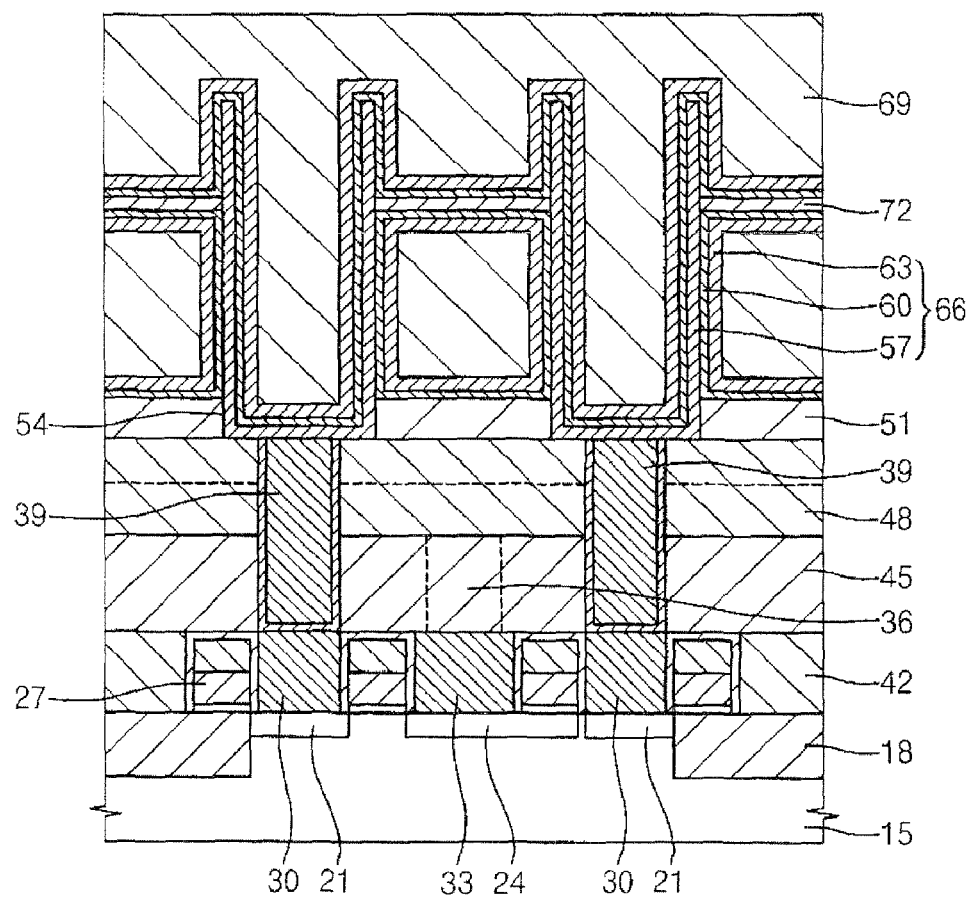
FIG. 2 is a cross sectional view illustrating a conventional semiconductor device including a beam-shaped insulating member.
Figure 3:
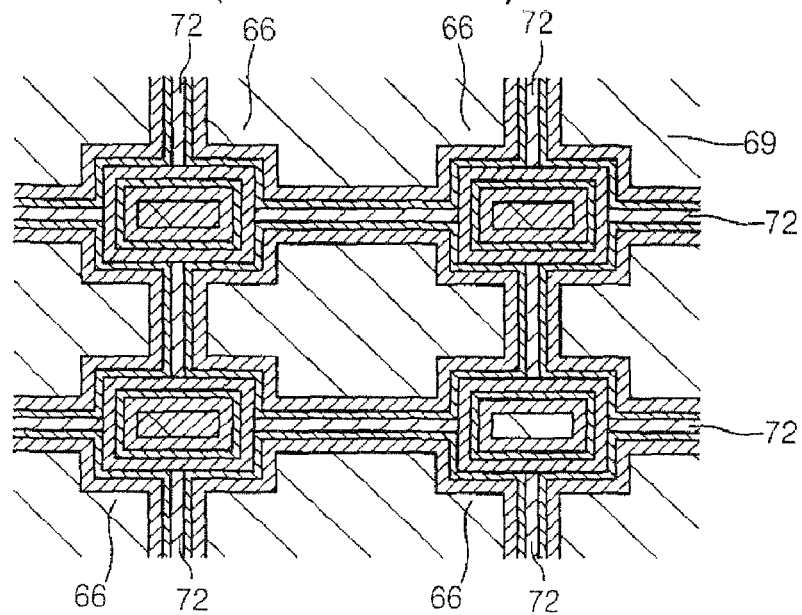
FIG. 3 is a plan view illustrating the semiconductor device in FIG. 2.

The invention will be described below with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like reference numerals refer to similar or identical elements throughout. It will be understood that when an element such as a layer, region or substrate is referred to as being "on" or "onto" another element, it can be directly on the other element or intervening elements may also be present.

FIGS. 4 to 31 are cross-sectional views, plan views and a perspective view illustrating a method of forming a semiconductor device including capacitors in accordance with one embodiment of the invention. In FIGS. 4 to 31, same numerical references refer to same elements.

Figure 4:
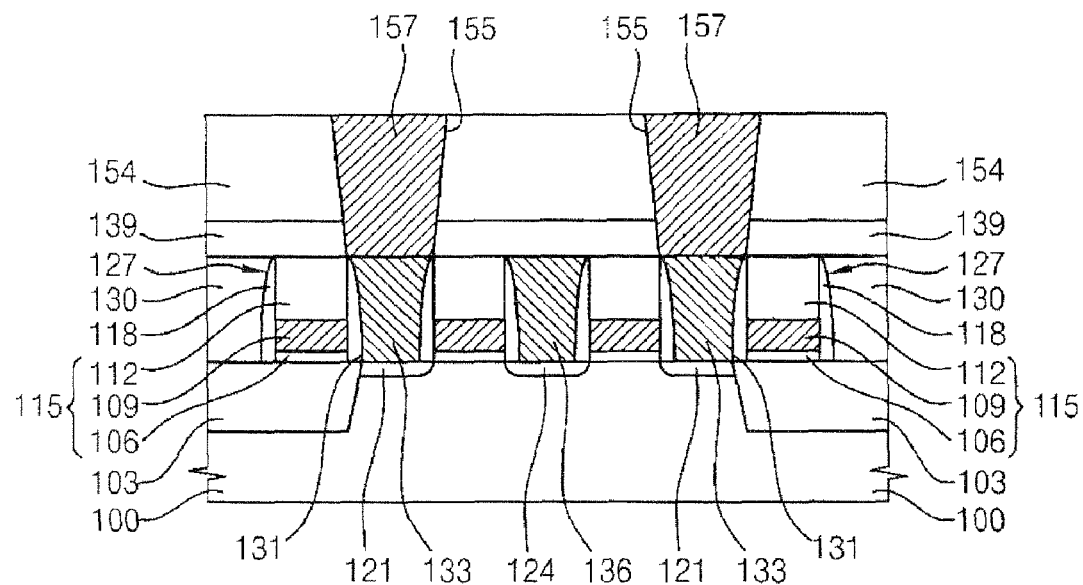
FIGS. 4 and 5 are cross sectional views illustrating steps for forming conductive structures on a substrate in accordance with one embodiment of the invention.
Figure 5:
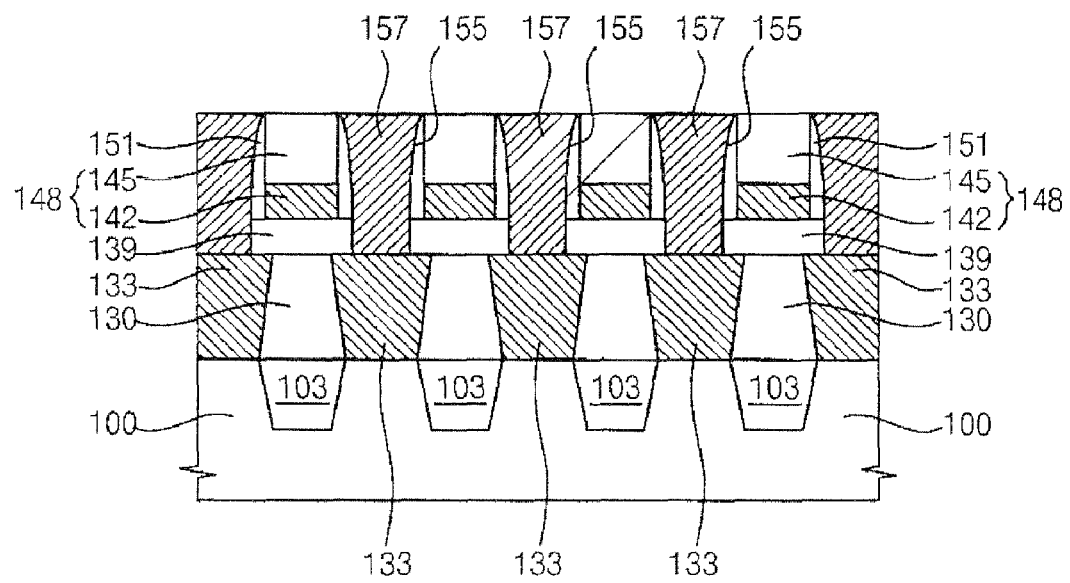

FIGS. 4 and 5 are cross sectional views illustrating steps for forming conductive structures on a substrate in accordance with one embodiment of the invention. FIG. 4 is a cross sectional view taken along a bit line of a semiconductor device, and FIG. 5 is a cross sectional view taken along a word line of the semiconductor device.

Referring to FIGS. 4 and 5, the semiconductor substrate 100 is divided into an active region and a field region by forming an isolation layer 103 at surface portions of the semiconductor substrate 100. The isolation layer 103 may be formed by a shallow trench isolation (STI) process or local oxidation of silicon (LOCOS) process.

A thin gate oxide layer (not shown) is formed on the semiconductor substrate 100 by a thermal oxidation process or a chemical vapor deposition (CVD) process. Here, the gate oxide layer is formed in the active region defined by the isolation layer 103. The gate oxide layer will be patterned to form a gate oxide layer pattern 106.

A first conductive layer (not shown) and a first mask layer (not shown) are successively formed on the gate oxide layer. The first conductive layer and the first mask layer correspond to a gate conductive layer and a gate mask layer, respectively. The first conductive layer may include polysilicon doped with impurities. The first conductive layer will be patterned to form a gate conductive pattern 109. Alternatively, the first conductive layer has a polycide structure that includes a doped polysilicon film and a metal silicide film formed on the doped polysilicon film. The first mask layer is formed using a material that has an etching selectivity with respect to a first insulating interlayer 130. For example, the first mask layer is formed using nitride such as silicon nitride when the first insulating interlayer 130 includes oxide. The first mask layer will be patterned to form a gate mask pattern 112.

After a first photoresist film (not shown) is formed on the first mask layer, the first photoresist film is exposed and developed to form a first photoresist pattern (not shown) on the first mask layer. The first mask layer, the first conductive layer and the gate oxide layer are partially etched using the first photoresist pattern as an etching mask to thereby form gate structures 115 on the semiconductor substrate 100. Each of the gate structures 115 includes a gate oxide pattern 106, the gate conductive pattern 109 and the gate mask pattern 112. That is, the first mask layer, the first conductive layer and the gate oxide layer are successively etched, thereby forming the gate structures 115 on the semiconductor substrate 100.

In one embodiment of the invention, the first mask layer is etched using the photoresist pattern as an etching mask so that the gate mask patterns 112 are formed on the first conductive layer. After the first photoresist pattern is removed from the gate mask pattern 112 by an ashing and a stripping process, the first conductive layer and the gate oxide layer are successively etched using the gate mask pattern 112 as an etching mask. As a result, the gate structures 115 including the gate oxide patterns 106, the gate conductive patterns 109 and the gate mask patterns 112 are formed on the semiconductor substrate 100.

A first insulation layer (not shown) is formed on the semiconductor substrate 100 to cover the gate structures 115. The first insulation layer may be formed using a nitride such as silicon nitride. The first insulation layer is anisotropically etched to form first spacers 118 on sidewalls of the gate structures 115, respectively. The first spacers 118 correspond to gate spacers.

After impurities are implanted into surface portions of the semiconductor substrate 100 exposed between the gate structures 115 that have the first spacers 118 using the gate structures 115 including the first spacers 118 as masks by an ion implantation process, the implanted impurities are thermally treated to thereby form first contact regions 121 and second contact regions 124 at the exposed portion of the semiconductor substrate 100. The first and second contact regions 121 and 124 correspond to source/drain regions of transistors, respectively. As a result, a plurality of word lines 127 is formed on the semiconductor substrate 100. The word lines 127 include MOS transistors having the gate structures 115 and the first and second contact regions 121 and 124. Here, adjacent word lines 127 are electrically separated by the first spacers 118 and the gate mask patterns 112 thereof. The first and second contact regions 121 and 124 also correspond to capacitor contact regions and bit line contact regions, respectively. For example, the first contact regions 121 may be the capacitor contact regions with which first pads 133 make contact, whereas the second contact regions 124 may be the bit line contact regions with which second pads 136 make contact.

In one embodiment of the invention, before forming the first spacers 118 on the sidewalls of the gate structures 115, first impurities are primarily implanted into the exposed portions of the substrate 100 between the gate structures 115 so as to form lightly doped regions having a relatively low concentration. Then, second impurities are secondarily implanted into the exposed portion of the substrate 100 after forming the first spacers 118, thereby forming heavily doped regions having a relatively high concentration. As a result, the first and second contact regions 121 and 124 having lightly doped drain (LDD) structures are formed at the exposed portion of the substrate 100.

The adjacent word lines 127 are electrically separated from each other because the first spacers 118 are formed on the sides of the word lines 127. That is, since the gate mask 112 and the first spacers 118 are formed on the upper face and the side face of the word lines 127, the adjacent word lines 127 are electrically isolated from each other.

Still referring to FIGS. 4 and 5, the first insulating interlayer 130 is formed on the semiconductor substrate 100 to cover the word lines 127. Examples of the first insulating interlayer 130 may include boro-phosphor silicate glass (BPSG), phosphor silicate glass (PSG), undoped silicate glass (USG), spin on glass (SOG), tetraethylorthosilicate (TEOS), high density plasma-chemical vapor deposition (HDP-CVD) oxide, etc. These may be used alone or in a combination thereof.

The first insulating interlayer 130 is planarized by a chemical mechanical polishing (CMP) process, an etch-back process or a combination process of CMP and etch back. Here, the planarized first insulating interlayer 130 has a predetermined thickness measured from upper faces of the word lines 127. Alternatively, the first insulating interlayer 130 is etched until the upper face of the word lines 127 is exposed.

After a second photoresist film (not shown) is formed on the planarized first insulating interlayer 130, the second photoresist film is exposed and developed to form a second photoresist pattern (not shown) on the first insulating interlayer 130.

Using the second photoresist patterns as an etching mask, the first insulating interlayer 130 is partially etched to form first contact holes 131 exposing the first and second contact regions 121 and 124, respectively. Preferably, the first insulating interlayer 130 of oxide is etched using an etching gas that has an etching selectivity with respect to the gate mask pattern 112 of nitride. Hence, the first contact holes 131 are formed through the first insulating interlayer 130 by a self-alignment process. That is, the first contact holes 131 are self-aligned relative to the word lines 127 including the first spacers 118. Here, some first contact holes 131 expose the first contact regions 121 corresponding to the capacitor contact regions, and other first contact holes 131 expose the second contact regions 124 corresponding to the bit line contact regions.

After removing the second photoresist pattern by an ashing and stripping process, a second conductive layer (not shown) is formed on the first insulating layer 130 to fill the first contact holes 131. The second conductive layer may be formed using conductive material such as doped polysilicon or metal.

The second conductive layer is etched by a CMP process, an etch-back process or a combination process of CMP and etch-back until the first insulating interlayer 130 is exposed. Thus, the first and second pads 133 and 136 filling up the first contact holes 113 are formed on the first and second contact regions 121 and 124, respectively. Each of the first pads 133 corresponds to a first storage node contact pad, and each of the second pads 124 corresponds to a first bit line contact pad. Since the first contact holes 113 are formed by the self-alignment process, the first and second pads 133 and 136 correspond to self-aligned contact (SAC) pads. As described above, the first pads 133 makes contact with the first contact regions 121 corresponding to the capacitor contact region, and the second pads 124 makes contact with the second contact regions 124 corresponding to the bit line contact regions.

A second insulating interlayer 139 is formed on the first insulating interlayer 130 including the first and second pads 133 and 136. The second insulating interlayer 139 electrically isolates the first pads 133 from the bit lines 148 successively formed on the second insulating interlayer 139. Examples of the second insulating interlayer 139 may include BPSG, PSG, SOG, USG, TEOS, HDP-CVD oxide, etc. These may be used alone or in a combination thereof. The second insulating interlayer 139 may be formed using BPSG, PSG, SOG, USG, TEOS and HDP-CVD oxide, etc., identical to that of the first insulating interlayer 130. These may be used alone or in a combination thereof. Alternatively, the second insulating interlayer 139 may be formed using other conventional materials different from that of the first insulating interlayer 130.

The second insulating interlayer 139 is etched by a CMP process, an etch-back process, or a combination process of CMP and etch-back to planarize an upper face of the second insulating interlayer 139.

After a third photoresist film (not shown) is formed on the planarized second insulating interlayer 139, the third photoresist film is exposed and developed to form a third photoresist pattern (not shown) on the second insulating interlayer 139.

The second insulating interlayer 139 is partially etched using the third photoresist pattern as an etching mask to form second contact holes (not shown) that expose the second pads 136 corresponding to the first bit line contact pads. The second contact holes correspond to bit line contact holes that electrically connect the second pads 136 to the bit lines 148, respectively.

In one embodiment of the invention, a first anti-reflective layer (ARL) may be additionally formed between the second insulating interlayer 139 and the third photoresist film to efficiently ensure the process margin of the photolithography process. Examples of the material used for the first ARL may include silicon oxide, silicon nitride, silicon oxynitride, etc. These may be used alone or in a combination thereof. Then, the photolithography process may be carried out to form the second contact holes through the second insulating interlayer 139.

After removing the third photoresist pattern by an ashing and stripping process, a third conductive layer (not shown) and a second mask layer (not shown) are successively formed on the second insulating interlayer 139. Here, the second contact holes are filled with the third conductive layer. The third conductive layer and the second mask layer are patterned to form bit line conductive patterns 142 and bit line mask patterns 145, respectively.

After a fourth photoresist film (not shown) is coated on the second mask layer, the fourth photoresist is exposed and developed to form a fourth photoresist pattern (not shown) on the second mask layer. Using the fourth photoresist pattern as an etching mask, the second mask layer and the third conductive layer are subsequently etched to form the bit lines 148 on the second insulating interlayer 139. Here, third pads filling the second contact holes are simultaneously formed. Each of the bit lines 148 includes the bit line mask pattern 145 and the bit line conductive pattern 142. The third pads correspond to second bit line contact pads that electrically connect the second pads 136 to the bit lines 148. Additionally, the third pads correspond to bit line contact plugs.

Each of the bit line conductive patterns 142 may include a first film and a second film formed on the first film. The first film may include a metal and a metal compound such as titanium/titanium nitride (Ti/TiN), and the second film may include a metal such as tungsten (W).

Figure 23:
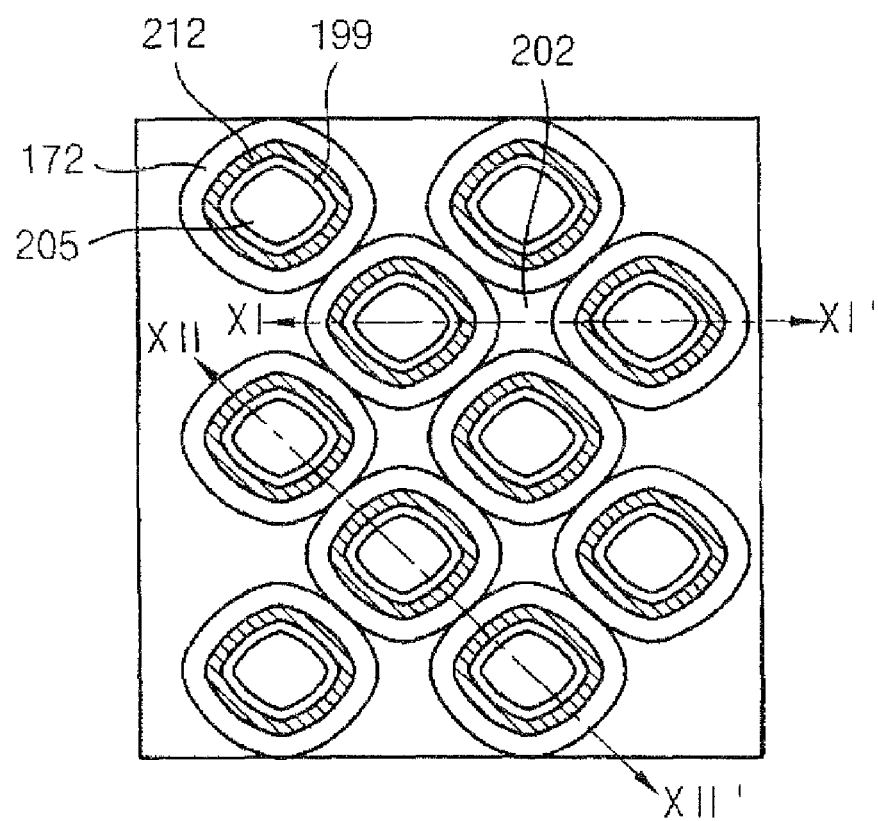
FIG. 23 is a plan view illustrating a step for forming a storage electrode.
Figure 24:
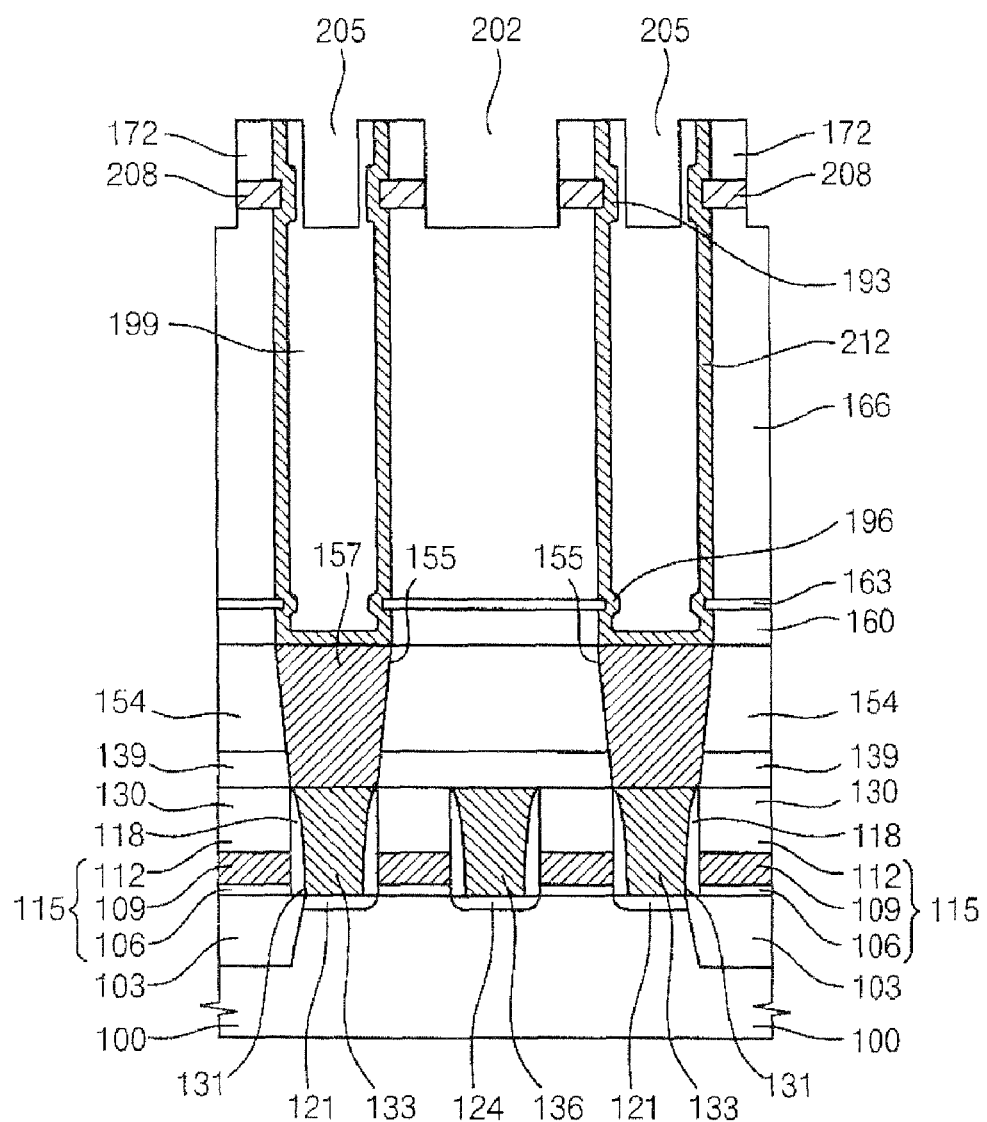
FIG. 24 is a cross sectional view taken along line XI-XI' in FIG. 23.
Figure 25:
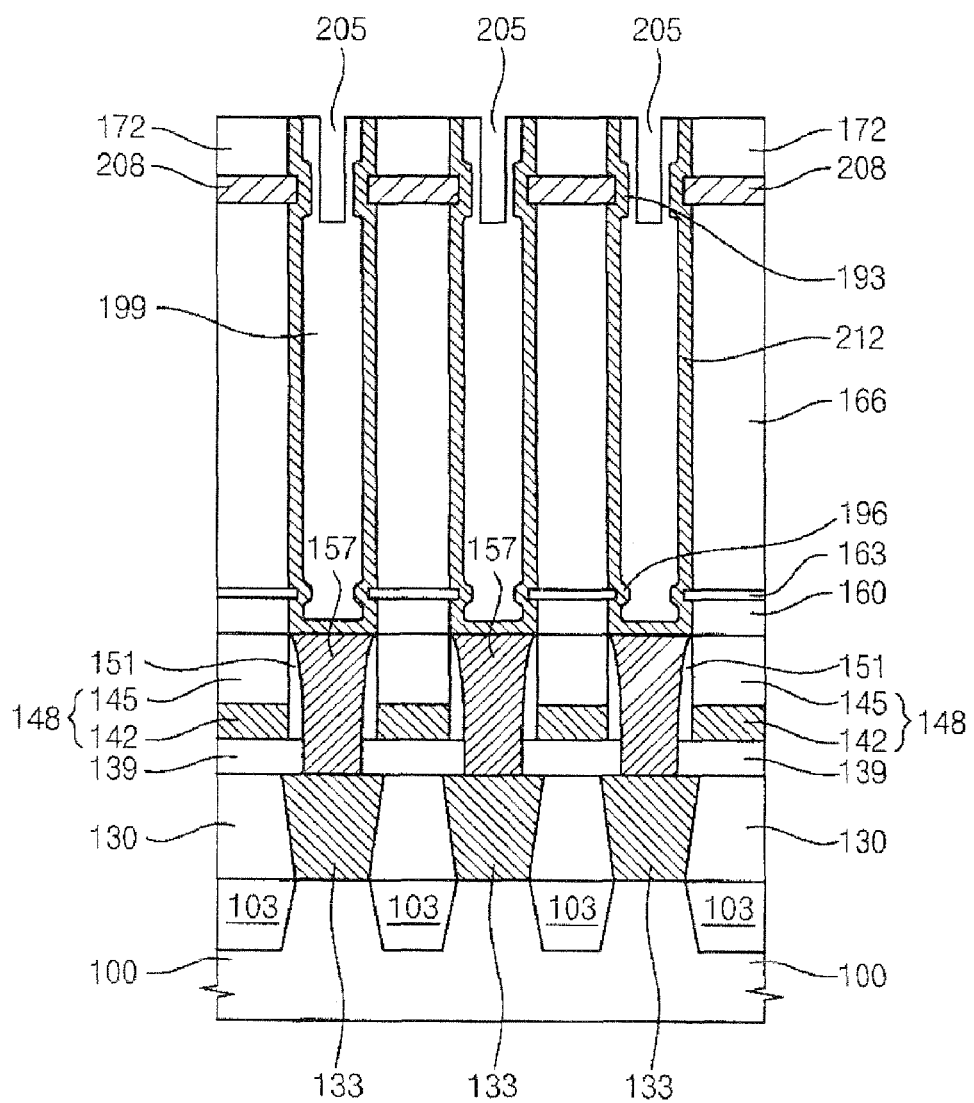
FIG. 25 is a cross sectional view taken along line XII-XII' in FIG. 23.

Each of the bit line mask patterns 145 protects the bit line conductive patterns 142 in an etching process for forming a storage electrode 212 (see FIGS. 23 to 25). The bit line mask pattern 145 is formed using a material that has an etching selectivity with respect to oxide included in a fourth insulating interlayer 160 and a mold layer 166 (see FIGS. 6 and 7). For example, the bit line mask pattern 145 is formed using a nitride such as silicon nitride.

In one embodiment of the invention, the second mask layer is patterned using the fourth photoresist pattern as an etching mask to form the bit line mask patterns 145 on the third conductive layer. Then, after removing the fourth photoresist pattern, the third conductive layer is patterned using the bit line mask patterns 145 as etching masks to thereby form the bit line conductive patterns 142 on the second insulating interlayer 139. Here, the third pads are simultaneously formed in the second contact holes to electrically connect the bit line conductive patterns 142 to the second pads 136, respectively.

In one embodiment of the invention, after an additional conductive layer is formed on the second insulating interlayer 139 to fill up the second contact holes, the additional conductive layer is etched until the second insulating interlayer 139 is exposed. Hence, the third pads making contact with the second pads 136 are formed in the second contact holes. Subsequently, the third conductive layer and the second mask layer are formed on the second insulating interlayer 139 including the third pads. The third conductive layer and the second mask layer are patterned to form the bit lines 148 as described above. In particular, a barrier metal layer and a metal layer are successively formed on the second insulating interlayer 139 to fill up the second contact holes. The barrier metal layer may be formed using titanium/titanium nitride, and the metal layer may be formed using tungsten. The metal and barrier metal layers are etched by a CMP process, an etch-back process, or a combination process of CMP and etch-back until the second insulating interlayer 139 is exposed. Thus, the third pads are formed in the second contact holes. After the third conductive layer and the second mask layer are formed on the second insulating interlayer 139 and on the third pads, the third conductive layer and the second mask layer are patterned to form the bit lines 148 including the bit line conductive patterns 142 and the bit line mask patterns 145. Here, each of the bit line conductive patterns 142 includes one metal layer of tungsten.

Still referring to FIGS. 4 and 5, a second insulation layer (not shown) is formed on the second insulating interlayer 139 to cover the bit lines 148. The second insulation layer is anisotropically etched to form second spacers 151 on sidewalls of the bit lines 148. The second spacers 151 correspond to bit line spacers. The second spacers 151 protect the bit lines 148 in a subsequent etching process for forming the fourth pads 157 that correspond to second storage node contact pads. The second spacers 151 may include a material that has etching selectivity with respect to the second insulating interlayer 139 and a third insulating interlayer 154 successively formed. For example, the second spacers 151 may include a nitride such as silicon nitride.

The third insulating interlayer 154 is formed on the second insulating interlayer 139 to cover the bit lines 148 including the second spacers 151. Examples of the insulating material that may be used for the third insulating interlayer 154 includes BPSG, PSG, TEOS, USG, SOG, HDP-CVD oxide, etc. These may be used alone or in a combination thereof. As described-above, the third insulating interlayer 154 may be formed using material identical to that of the second insulating interlayer 139 and/or that of the first insulating interlayer 130. Alternatively, the third insulating interlayer 154 may include a material different from that of the second insulating interlayer 139 and/or the first insulating interlayer 130. Preferably, the third insulating interlayer 154 may be formed using HDP-CVD oxide that may advantageously fill gaps between the bit lines 148 without voids therein and may be formed at low temperature.

The third insulating interlayer 154 is etched by a CMP process, an etch back process or a combination process of CMP and etch back until the upper faces of the bit lines 148 are exposed, thereby planarizing the third insulating interlayer 154.

In one embodiment of the invention, the third insulating interlayer 154 may be planarized without exposure of the bit lines 148. Here, the third insulating interlayer 154 has predetermined height measured from the upper faces of the bit lines 148.

In one embodiment of the invention, to prevent generation of voids in the third insulating interlayer 154 between adjacent bit lines 148, an additional insulation layer (not shown) may be formed on the second insulating interlayer 139 including the bit lines 148. Then, the third insulating interlayer 154 is formed on the additional insulation layer. Here, the additional insulation layer may have a thickness of about 50 to about 200 Å. The additional insulation layer may be formed using a nitride.

After a fifth photoresist film (not shown) is formed on the planarized third insulating interlayer 154, the fifth photoresist film is exposed and developed to form a fifth photoresist pattern (not shown) on the third insulating interlayer 154.

The third insulating interlayer 154 and the second insulating interlayer 139 are partially etched using the fifth photoresist pattern as an etching mask, third contact holes 155 are formed through the third insulating interlayer 154 and the second insulating interlayer 139. The third contact holes 155 expose the first pads 133 corresponding to the first storage node contact pads. The third contact holes 155 correspond to first storage node contact holes. Here, the third contact holes 155 are self-aligned relative to the second spacers 151 positioned on the sidewalls of the bit lines 148.

In one embodiment of the invention, a second ARL layer (not shown) may be additionally formed on the third insulating interlayer 154 to ensure process margin of a subsequent photolithography process.

In another embodiment of the invention, after forming the third contact holes 155 corresponding to the first storage node contact holes, an additional cleaning process may be performed against the semiconductor substrate 100 including the resultant structure. As a result, a native oxide layer or various particles remaining on the first pads 121 may be removed from the first pads 121.

After forming a fourth conductive layer (not shown) is formed on the third insulating interlayer 154 to fill the third contact holes 155, the fourth conductive layer is etched by a CMP process, an etch back process or a combination process of CMP and etch back. Thus, the fourth pads 157 filling up the third contact holes 155 are formed. The fourth pads 157 correspond to second storage node contact pads. The fourth pads 157 are generally formed using doped polysilicon. Each of the fourth pads 157 electrically connects each of the first pads 133 to each of the storage electrodes 212 (see FIGS. 23 to 25) successively formed on the fourth pad 157. Hence, the storage electrodes 212 are electrically connected to the first contact region 121 through the first pads 133 and the fourth pads 157, respectively.

FIGS. 6 to 13 are plan views and cross sectional views illustrating the formation of a mold structure on the conductive structure.

Figure 6:
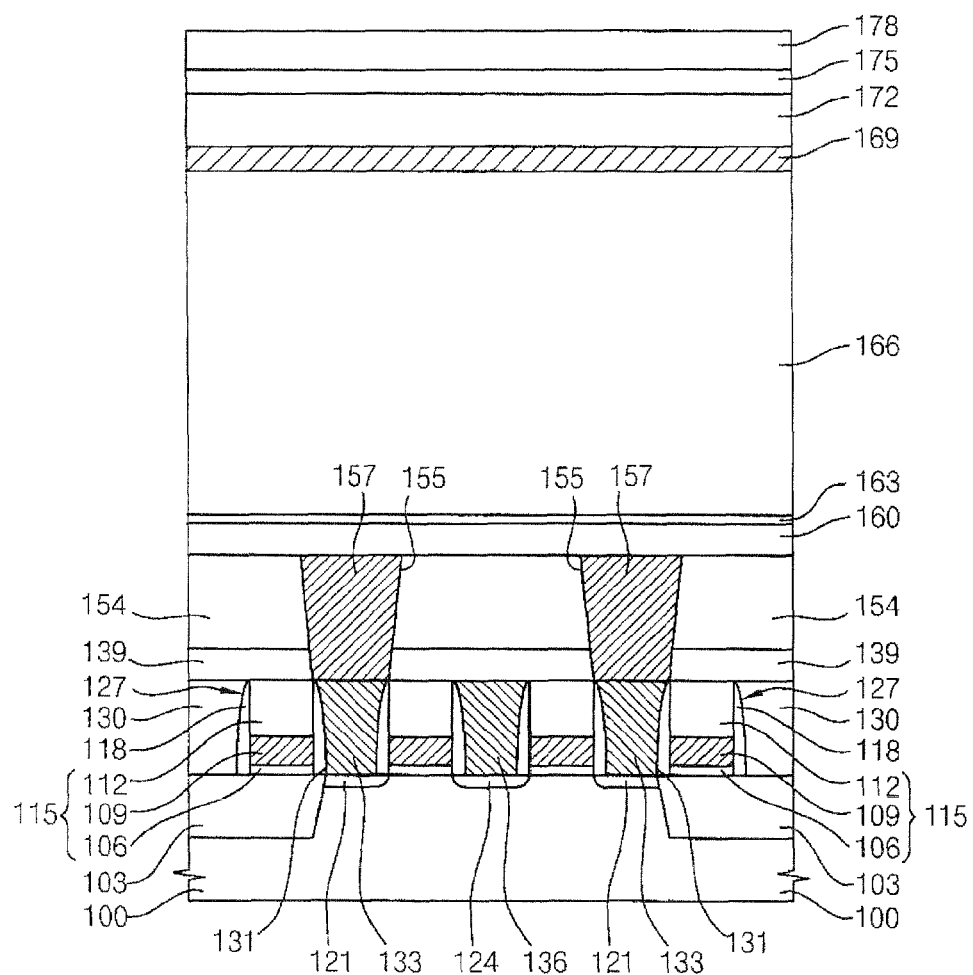
FIGS. 6 and 7 are cross sectional views illustrating steps for forming mold layers on the conductive structures in FIG. 5.
Figure 7:
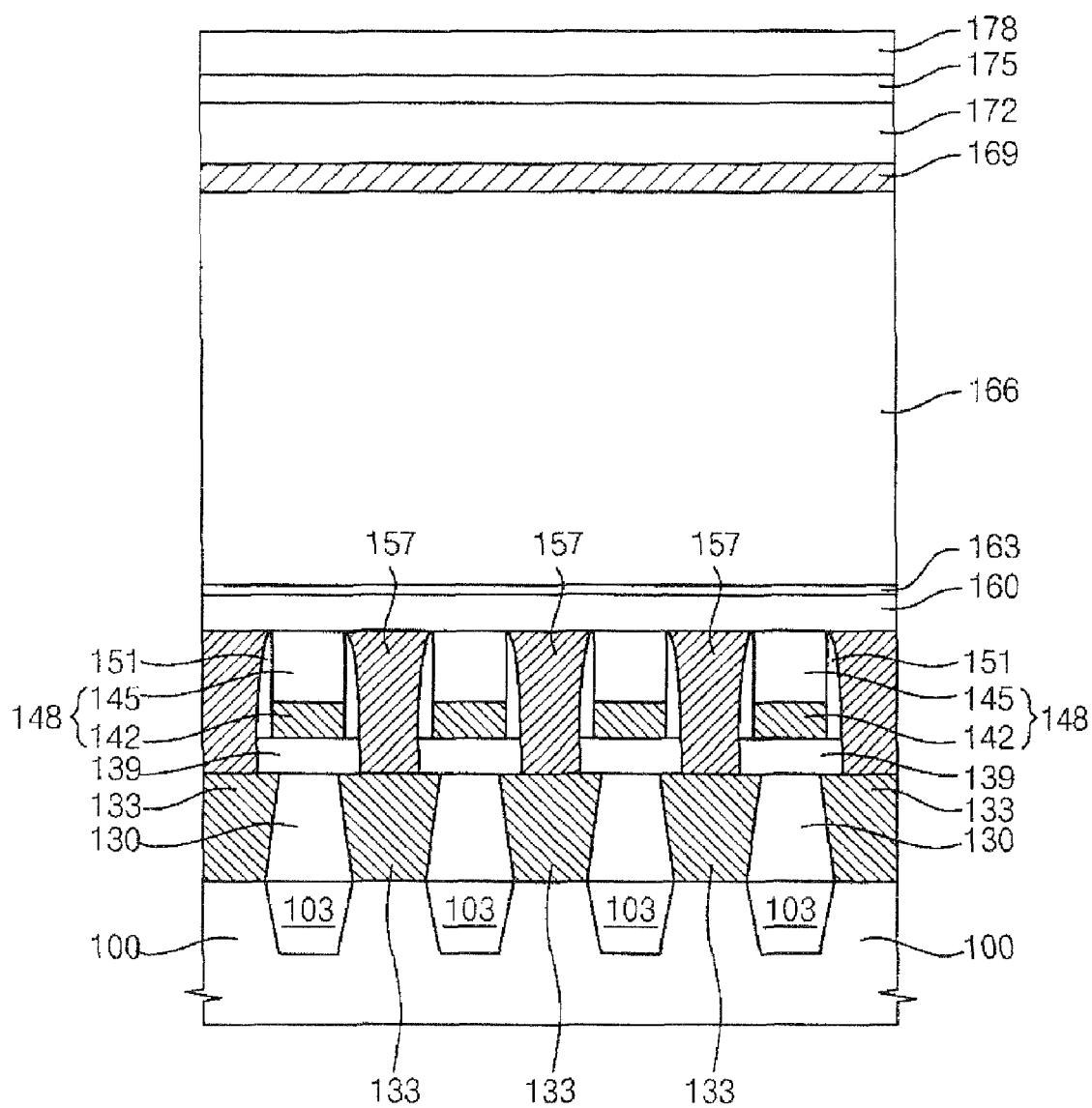

FIGS. 6 and 7 are cross sectional views illustrating the formation of mold layers on the conductive structures.

Referring to FIGS. 6 and 7, the fourth insulating interlayer 160 is formed on the third insulating interlayer 154, the fourth pads 157 and the bit lines 148. Examples of an insulating material that may be used for the fourth insulating interlayer 160 may include BPSG, PSG, SOG, USG, TEOS, HDP-CVD oxide, etc. These can be used alone or in a combination thereof. The fourth insulating interlayer 160 electrically isolates the bit lines 148 from the storage electrodes 212 (see FIGS. 23 to 25). As described above, the fourth insulating interlayer 160 may be formed using a material substantially identical to that of the third insulating interlayer 154 and/or that of the second insulating interlayer 139. In addition, the fourth insulating interlayer 160 may be formed using a material different from that of the third insulating interlayer 154 and/or that of the second insulating interlayer 139.

The etching stop layer 163 is formed on the fourth insulating interlayer 160. The etching stop layer 163 may be formed using a material that has an etching selectivity with respect to the fourth insulating interlayer 160 and the mold layer 166. For example, the etching stop layer 163 includes nitride such as silicon nitride. After the fourth insulating interlayer 160 may be planarized by a CMP process, an etch back process or a combination process of CMP and etch back, the etching stop layer 163 may be formed on the planarized fourth insulating interlayer 160.

The mold layer 166 is formed on the etching stop layer 163. The mold layer 166 is provided to form the storage electrodes 212. Examples of a material that may be used for the mold layer 166 may include HDP-CVD oxide, plasma enhanced TEOS (PE-TEOS), USG, BPSG, PSG, etc. These can be used alone or in a combination thereof. The mold layer 166 has a thickness of about 5,000 to about 50,000 Å measured from an upper face of the etching stop layer 163. The thickness of the mold layer 166 may vary in accordance with desired capacitance of capacitors 221 (see FIGS. 30 and 31). That is, because the height of the capacitors 221 are in proportion to the thickness of the mold layer 166, the thickness of the mold layer 166 may be advantageously adjusted so as to control the capacitance of the capacitors 221.

In the invention, since stabilizing members 208 (see FIGS. 20 to 22) are provided to greatly improve structural stability of the capacitors 221, the capacitors 221 may have a very high height without the capacitors 221 falling down. Namely, although the capacitors 221 of the invention may have a high aspect ratio, the capacitors 221 may not mechanically fall down toward each other because the stabilizing members 208 are positioned at upper potions of the capacitors 221, respectively. Therefore, each of the capacitors 221 may have greatly enhanced capacitance in comparison with a conventional capacitor.

Still referring to FIGS. 6 and 7, a second mold layer 169 is formed on the first mold layer 166. In one embodiment, the second mold layer 169 provided to form the stabilizing member 208 may have a thickness of about 400 Å to about 5,000 Å measured from an upper face of the first mold layer 166. However, the present invention is not limited to such thickness of the second mold layer 169.

A third mold layer 172 is formed on the second mold layer 169. The third mold layer 172 may have a thickness of about 1,000 Å to about 6,000 Å measured from the second mold layer 169. Examples of a material that may be used for the third mold layer 172 may include HDP-CVD oxide, plasma enhanced TEOS (PE-TEOS), USG, BPSG, PSG, SOG, etc. These can be used alone or in a combination thereof.

The third mold layer 172 may be formed using a material that has an etching selectivity substantially identical to the first mold layer 166. The first mold layer 166 or the third mold layer 172 includes a material that has an etching selectivity higher than the second mold layer 169. For example, the etching selectivity between the first mold layer 166 and the second mold layer 169 may be no less than about 200: 1. Examples of the first and third mold layers 166 and 172 are TEOS, HDP-CVD oxide, etc. These may be used alone or in a combination thereof. Thus, the first and third mold layers 166 and 172 are etched faster than the second mold layer 169 using an etching solution including hydrogen fluoride, or ammonium hydroxide, hydrogen peroxide and deionized water.

A fourth mold layer 175 is formed on the third mold layer 172. Examples of a material that may be used for the fourth mold layer 175 may include HDP-CVD oxide, plasma enhanced TEOS (PE-TEOS), USG, BPSG, PSG, SOG, etc. These can be used alone or in a combination thereof. The fourth mold layer 175 may have a thickness of no more than about half that of the storage electrode 212. The fourth mold layer 175 may have an etching selectivity higher than the first mold layer 166 or the third mold layer 172. For example, when the first mold layer 166 or the third mold layer 172 includes TEOS or HDP-CVD oxide, the fourth mold layer 175 may include oxide including impurities such as BPSG or PSG. Also, the etching selectivity of the fourth mold layer 175 including an oxide may vary in accordance with the concentrations of the impurities. Further, the etching selectivities of the first, second, third and fourth mold layers 166, 169, 172 and 175 may vary in accordance with process conditions such as a temperature, a pressure, a concentration of impurities, etc.

A third mask layer 178 is formed on the fourth mold layer 175. The third mask layer 178 has an etching selectivity with respect to the first, second, third and fourth mold layers 166, 169, 172 and 175. For example, the third mask layer 178 includes polysilicon or a nitride such as silicon nitride. The third mask layer 178 has a thickness of about 100 Å to about 6,000 Å measured from an upper face of the fourth mold layer 175.

Figure 8:
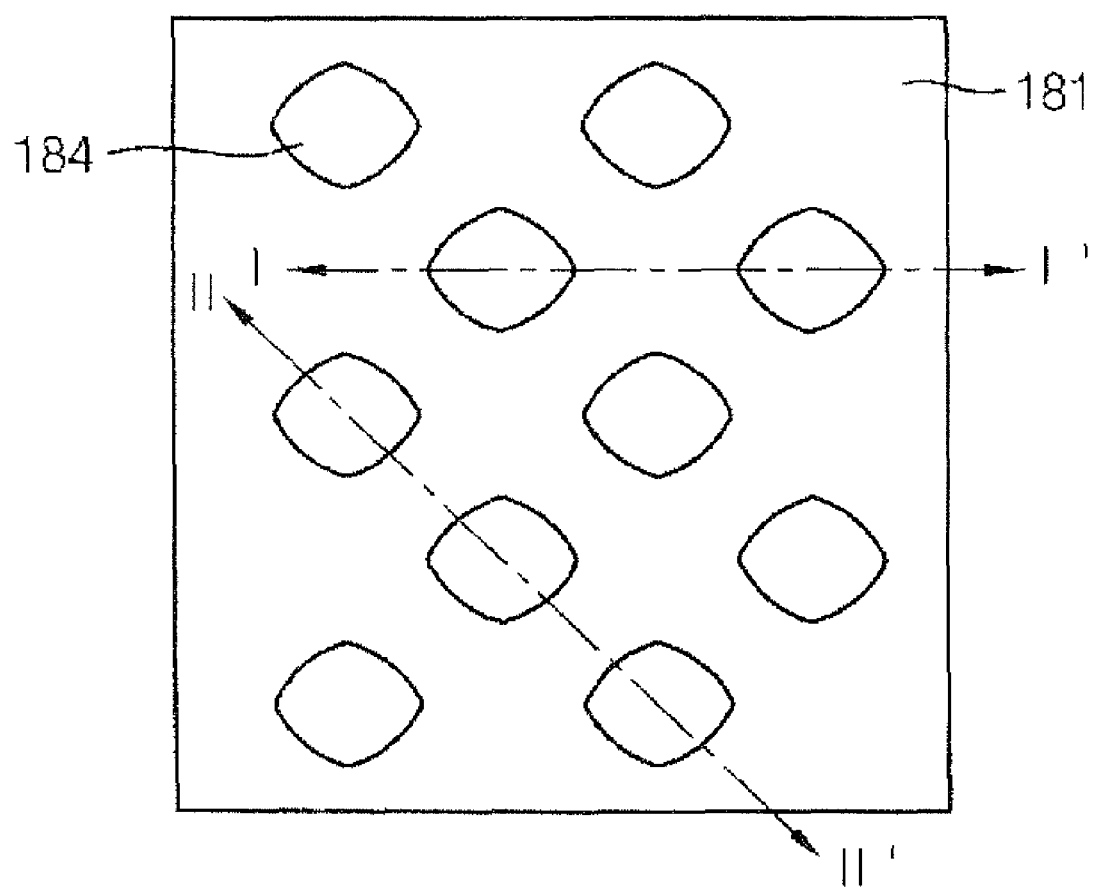
FIG. 8 is a plan view illustrating a step for forming a first opening.
Figure 9:
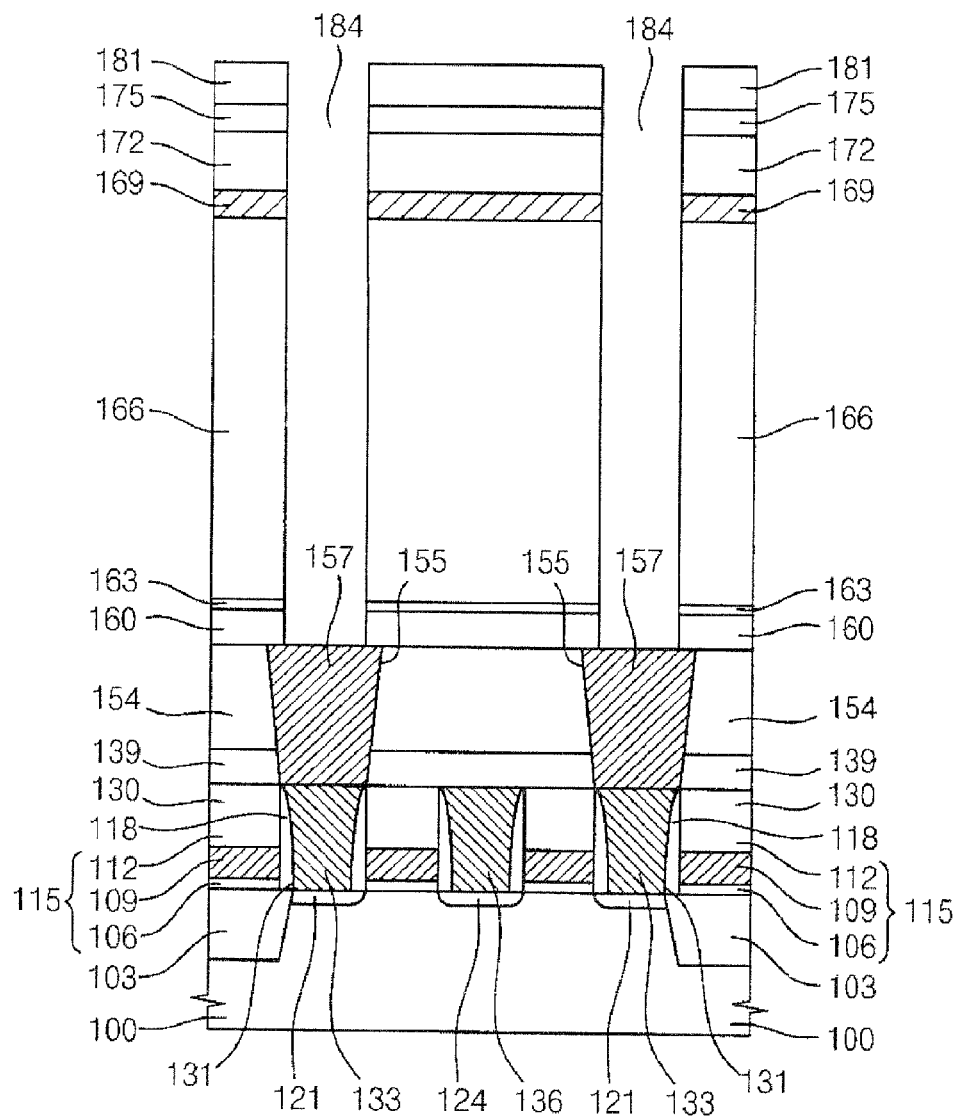
FIG. 9 is a cross sectional view taken along line I-I' in FIG. 8.

FIG. 8 is a plan view illustrating the formation of a first opening; FIG. 9 is a cross sectional view taken along line I-I' in FIG. 8; and FIG. 10 is a cross sectional view taken along line II-II' in FIG. 8.

Figure 10:
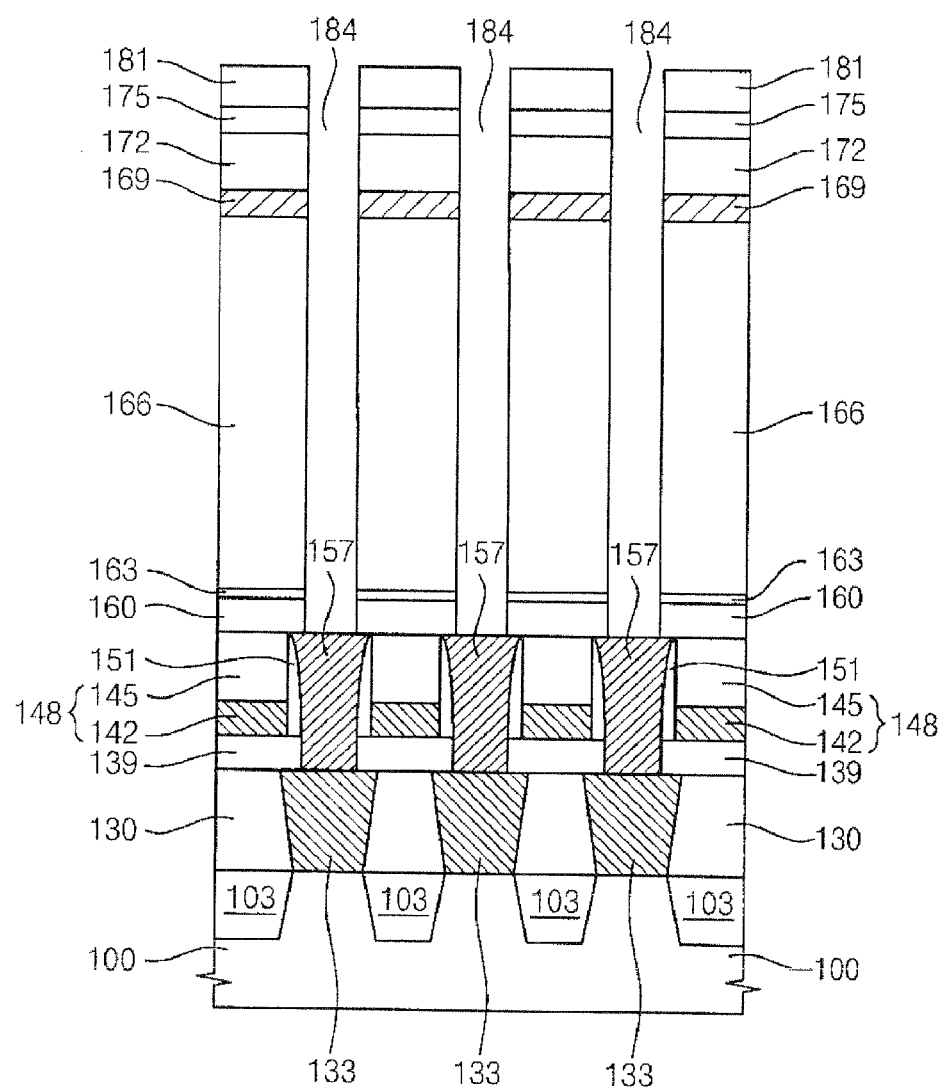
FIG. 10 is a cross sectional view taken along line II-II' in FIG. 8.

Referring to FIGS. 8 to 10, after a sixth photoresist film (not shown) is formed on the third mask layer 178, the sixth photoresist film is exposed and developed to form a sixth photoresist pattern (not shown) on the third mask layer 178.

The third mask layer 178 is patterned using the sixth photoresist pattern as an etching mask, thereby forming the storage node mask pattern 181 on the fourth mold layer 175. Additionally, an anti-reflective layer (not shown) for forming a sixth photoresist pattern may be formed on the third mask layer 178.

The first, second, third and fourth mold layers 166, 169, 172 and 175, the etching stop layer 163 and the fourth insulating interlayer 160 are sequentially and anisotropically etched using the storage node mask pattern 181 as an etching mask to thereby form the first openings 184 exposing the fourth pad 157. Examples of the anisotropic etching process include a plasma etching process, a reactive ion etching process, etc. The sixth photoresist pattern may be removed by an ashing process and/or a stripping process.

Figure 11:
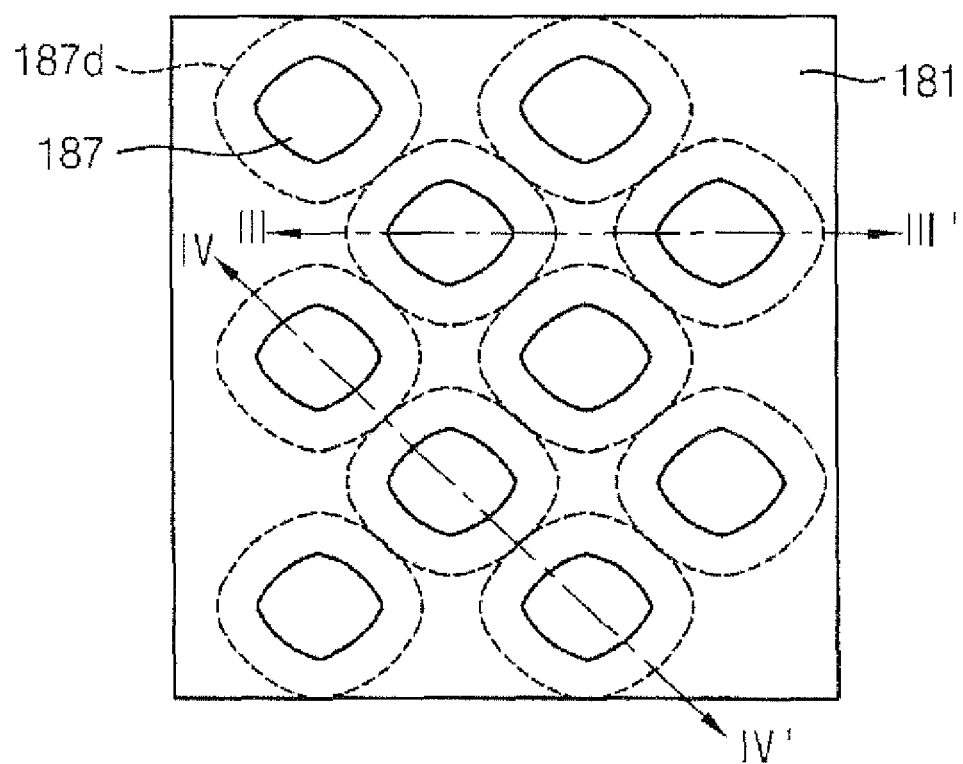
FIG. 11 is a plan view illustrating a step for forming a second opening.
Figure 12:
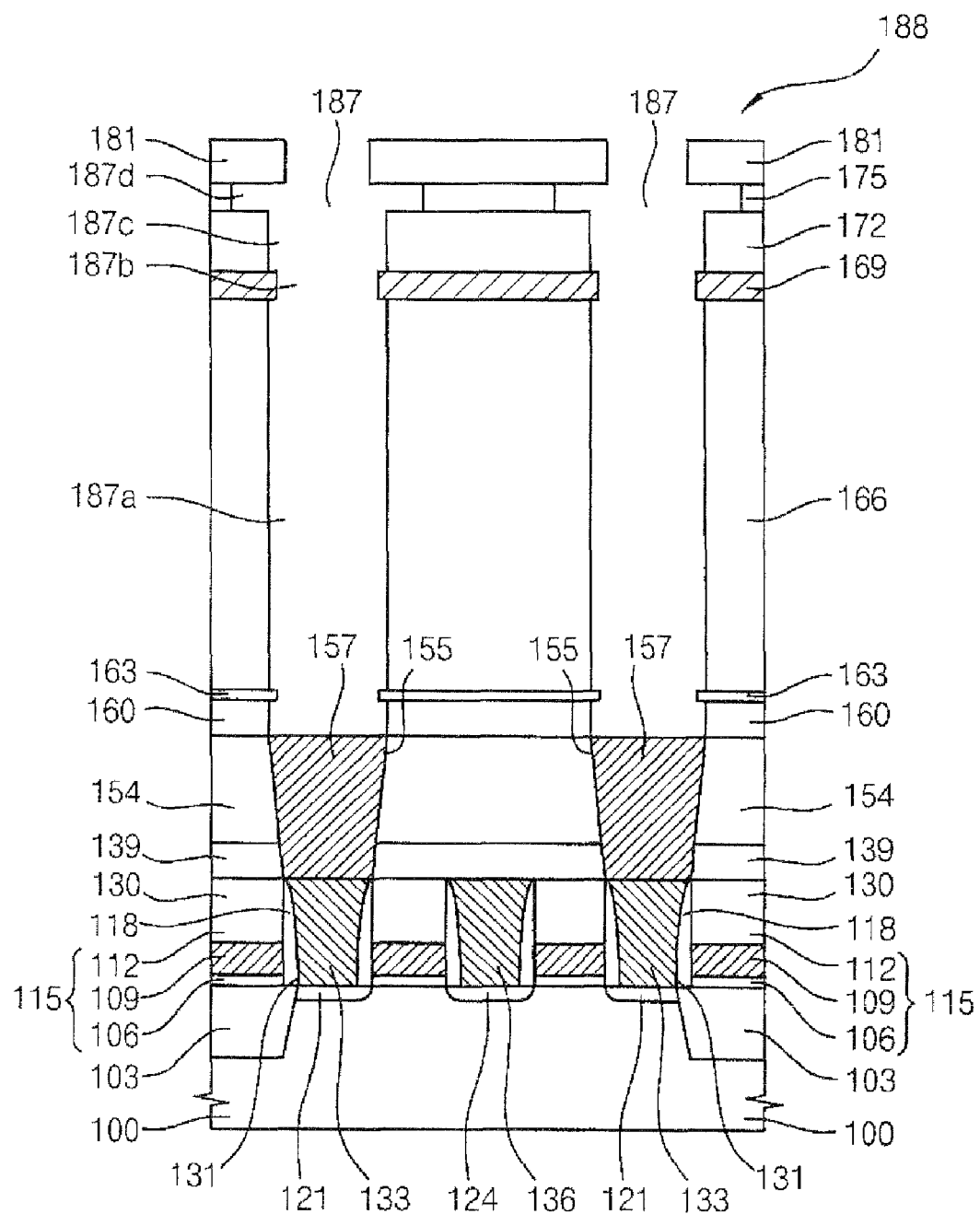
FIG. 12 is a cross sectional view taken along line III-III' in FIG. 11.

FIG. 11 is a plan view illustrating a step for forming a second opening; FIG. 12 is a cross sectional view taken along line III-III' in FIG. 11; and FIG. 13 is a cross sectional view taken along line IV-IV' in FIG. 11.

Figure 13:
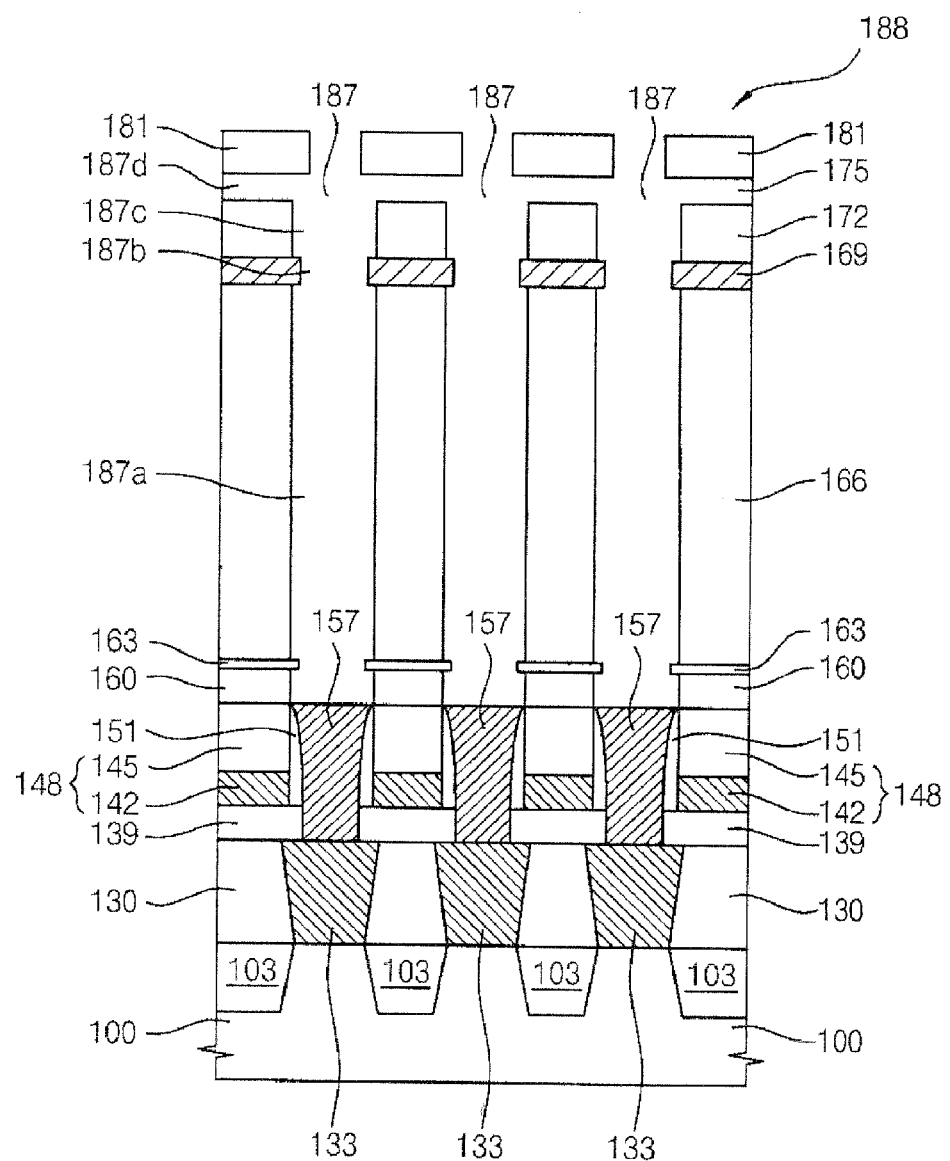
FIG. 13 is a cross sectional view taken along line IV-IV' in FIG. 11.

Referring to FIGS. 11 to 13, an inner side of the first opening 184 is removed by an isotropic etching process such as a wet etching process or a chemical dry etching (CDE) process to form a second opening 187 extending in a direction that is substantially perpendicular to the storage electrode 212. Here, examples of an etching solution that may be used in the wet etching process may include a solution including hydrogen fluoride, a solution including ammonium hydroxide, hydrogen peroxide and deionized water, a LAL solution including ammonium fluoride, hydrogen fluoride and distilled water, etc. These may be used alone or in a combination thereof. Examples of an etching gas used in the dry etching process may include a gas including hydrogen fluoride, a gas including tetra-fluoro carbon ($CH_4$) and oxygen, etc. These may be used alone or in a combination thereof.

On the other hand, as shown in FIGS. 8 to 10, the first openings 184 in a unitary cell are arranged spaced apart from each other in a direction I-I' substantially parallel and in a left or a right direction II-II' with respect to underlying conductive structures such as the word line 127 or the bit line 148. Namely, the first openings 184 are arranged by substantially same intervals in the direction I-I' substantially parallel to arrangement direction of the underlying conductive structures and in the direction II-II' inclined to the arrangement direction of the underlying conductive structures. Here, intervals between some first openings 184 that are arranged in the direction I-I' are wider than that between other first openings 184 that is arranged in the direction II-II'. Hereinafter, the direction I-I' is referred to as a first direction and the direction II-II' is referred to as a second direction.

Referring now to FIGS. 11 to 13, some second openings 178 arranged in the first direction is spaced apart from each other by remaining fourth mold layers 175. Also, other second openings 178 arranged in the second direction are in communication with each other.

Meanwhile, the first, second, third and fourth mold layers 166, 169, 172 and 175 have etching selectivity different from each other with respect to an etchant used in the isotropic etching process for forming the second openings 187. Thus, the second openings 187 formed by the isotropic etching process using the etchant includes a first region 187*a* having a first width and defined by the first mold layer 166, a second region 187*b* having a second width narrower than the first width and defined by the second mold layer 169, a third region 187*c* having a third width substantially identical to the first width and defined by the third mold layer 172, and a fourth region 187*d* having a fourth width wider than the first width and defined by the fourth mold layer 175.

In particular, the second mold layer 169 between the first mold layer 166 and the third mold layer 172 is etched slower than the first and third mold layers 166 and 172. Also, the fourth mold layer 175 on the third mold layer 172 is etched faster than the first and third mold layers 166 and 172. Therefore, the second openings 187 arranged in the second direction are in communication with each other through the fourth region 187*d*. The second openings 187 arranged in the first direction are separated from each other by the fourth mold layer 175. Also, the second mold layer 169 is protruded toward inside of the second openings 187. Further, the etching stop layer 163 having the etching selectivity lower than that of the first and third mold layers 166 and 172 is protruded toward the inside of the second openings 187.

Figure 14:
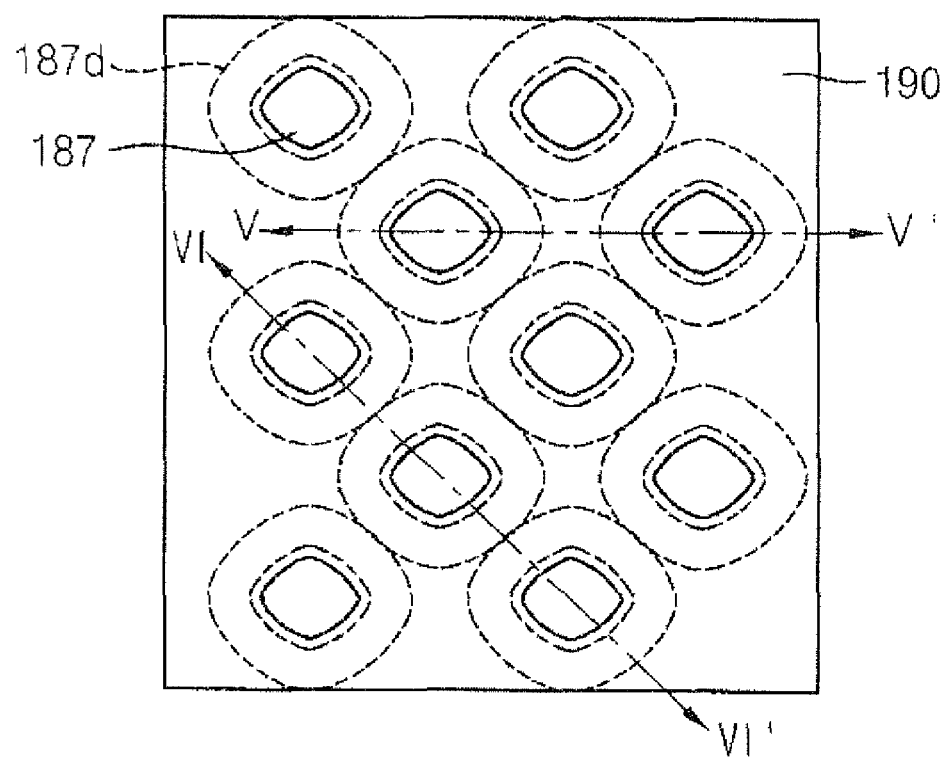
FIG. 14 is a plan view illustrating a step for forming a conductive layer as a storage electrode.
Figure 15:
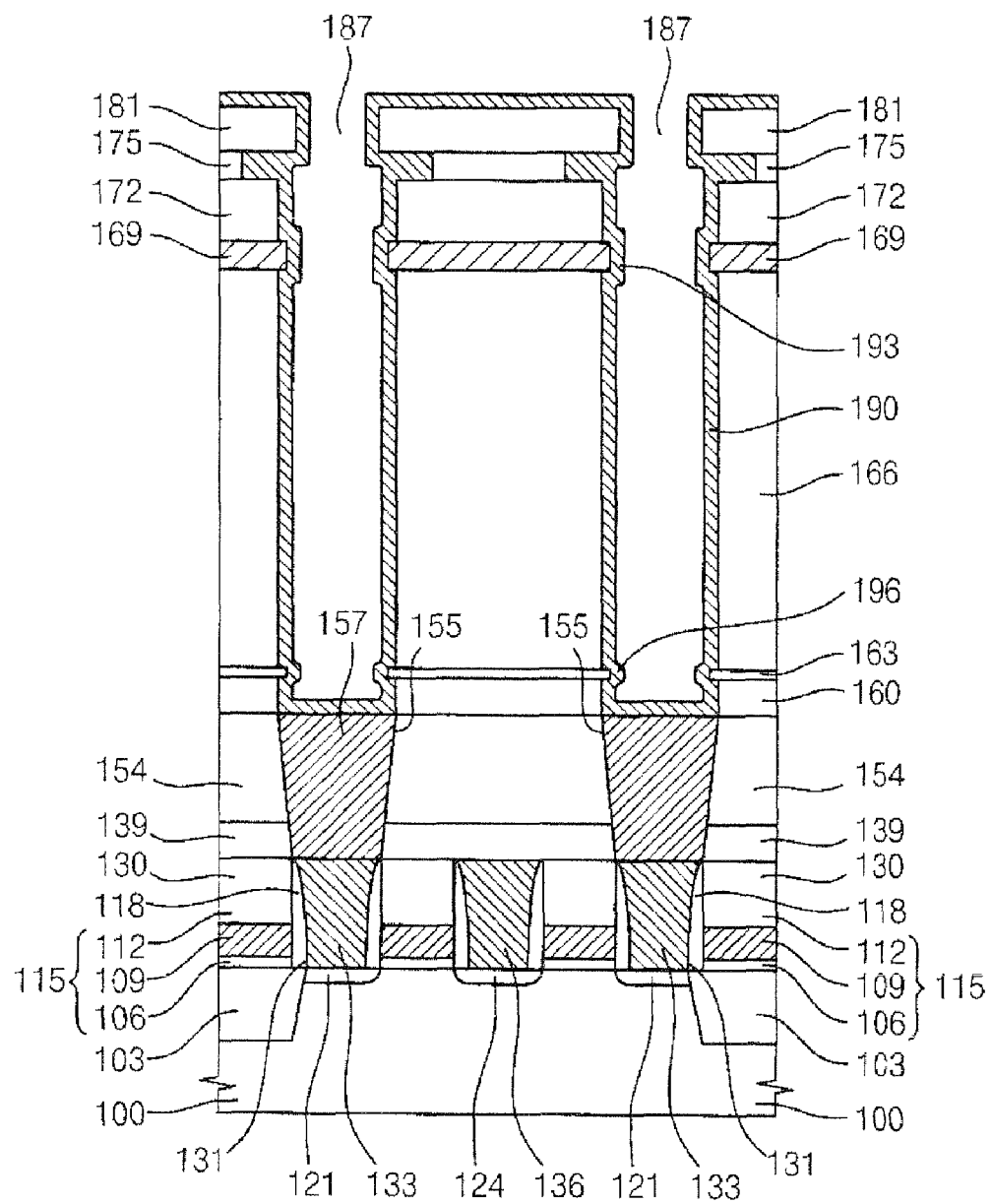
FIG. 15 is a cross sectional view taken along line V-V' in FIG. 14.
Figure 16:
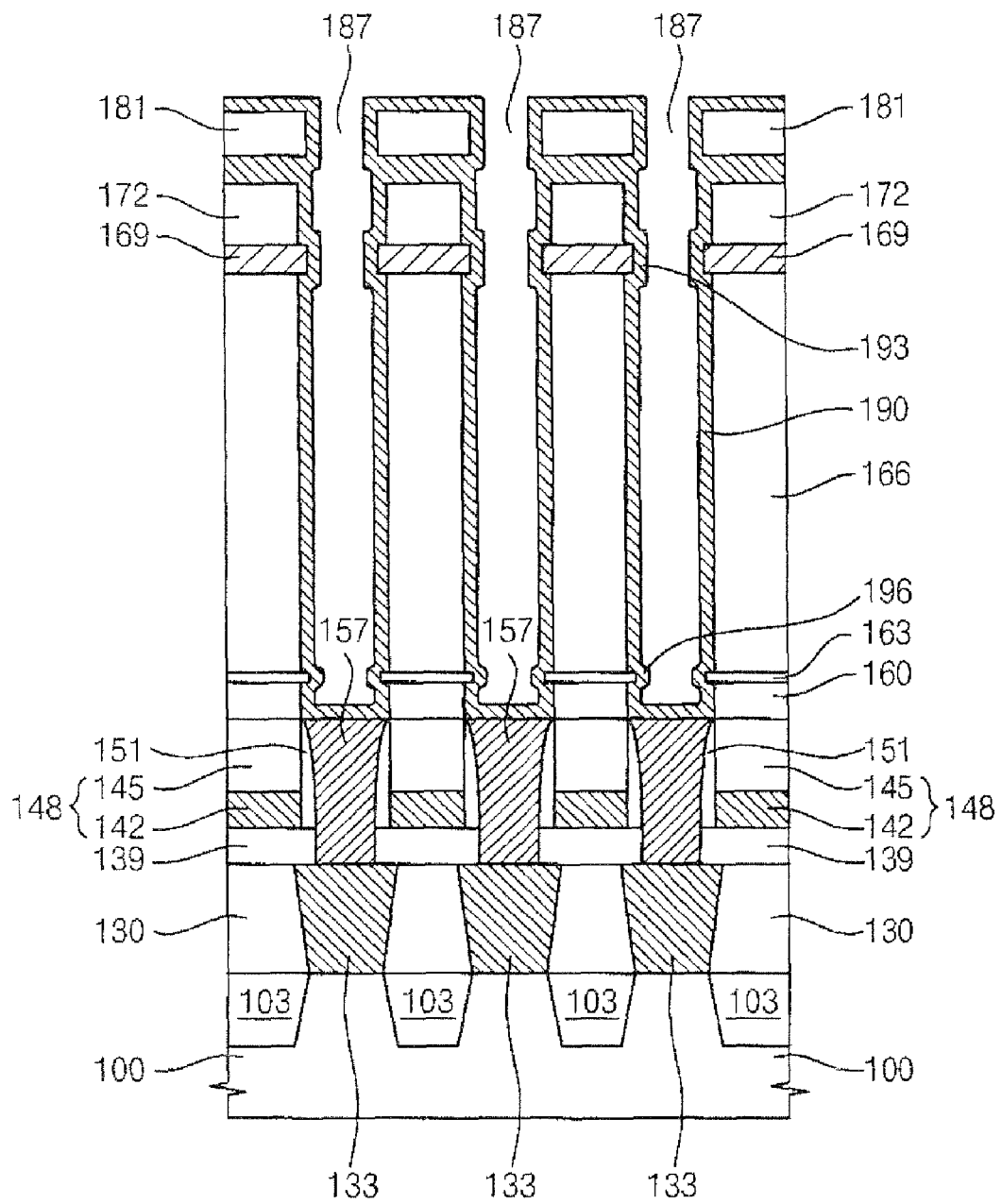
FIG. 16 is a cross sectional view taken along line VI-VI' in FIG. 14.

FIG. 14 is a plan view illustrating the formation of a conductive layer as a storage electrode, FIG. 15 is a cross sectional view taken along line V-V' in FIG. 14 and FIG. 16 is a cross sectional view taken along line VI-VI' in FIG. 14.

Referring to FIGS. 14 to 16, a conductive layer 190 is formed on inner sides of the storage node mask 181 and the second openings 187. Examples of a conductive material for the conductive layer 190 may include polysilicon doped with impurities, a metal, etc. The conductive layer 190 fills the fourth region 197*d* (see FIGS. 11 to 13) of the second openings 187 defined by the third mold layer 172, the fourth mold layer 175 and the storage node mask 181. When the fourth mold layer 175 has a thickness above about two times that of the conductive layer 190, the conductive layer 190 may not fill the fourth region 187*d* of the second openings 187. Thus, the thickness of the fourth mold layer 175 is preferably about no more than two times that of the conductive layer 190.

On the other hand, the second mold layer 169 and the etching stop layer 163 are protruded toward the inside of the second openings 187 by the isotropic etching process for forming the second openings 187. As a result, the conductive layer 190 includes a first annular protrusion 193 protruded toward the inside of the second openings 187 by a protruded portion of the second mold layer 169, and a second annular protrusion 196 protruded toward the inside of the second openings 187 by a protruded portion of the etching stop layer 163.

Figure 17:
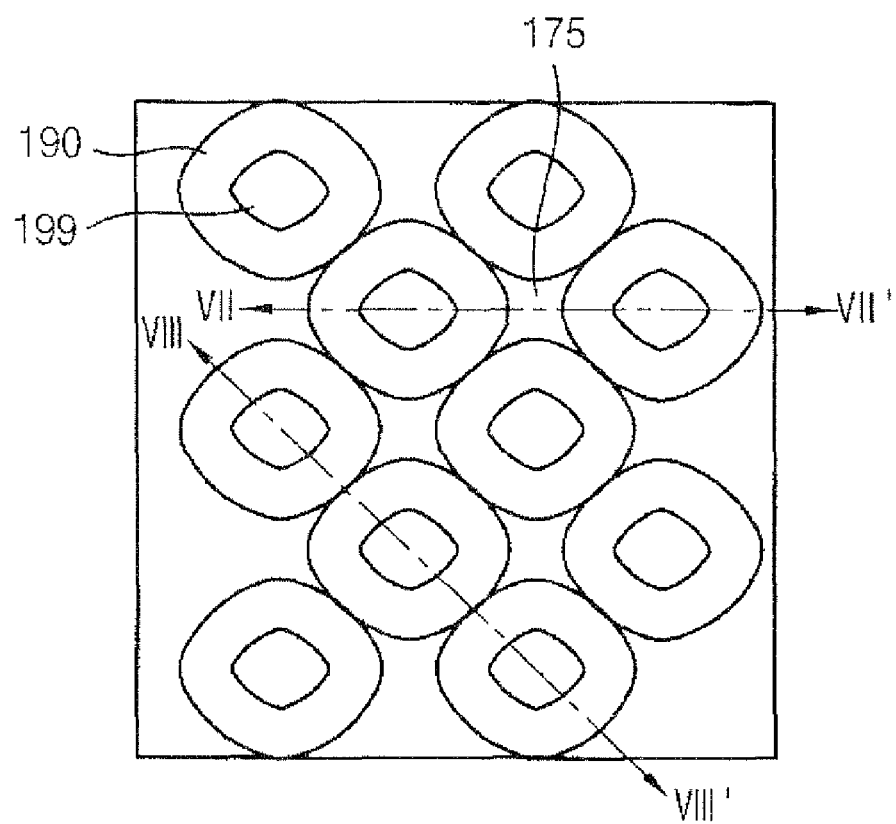
FIG. 17 is a plan view illustrating a step for removing a storage node mask.
Figure 18:
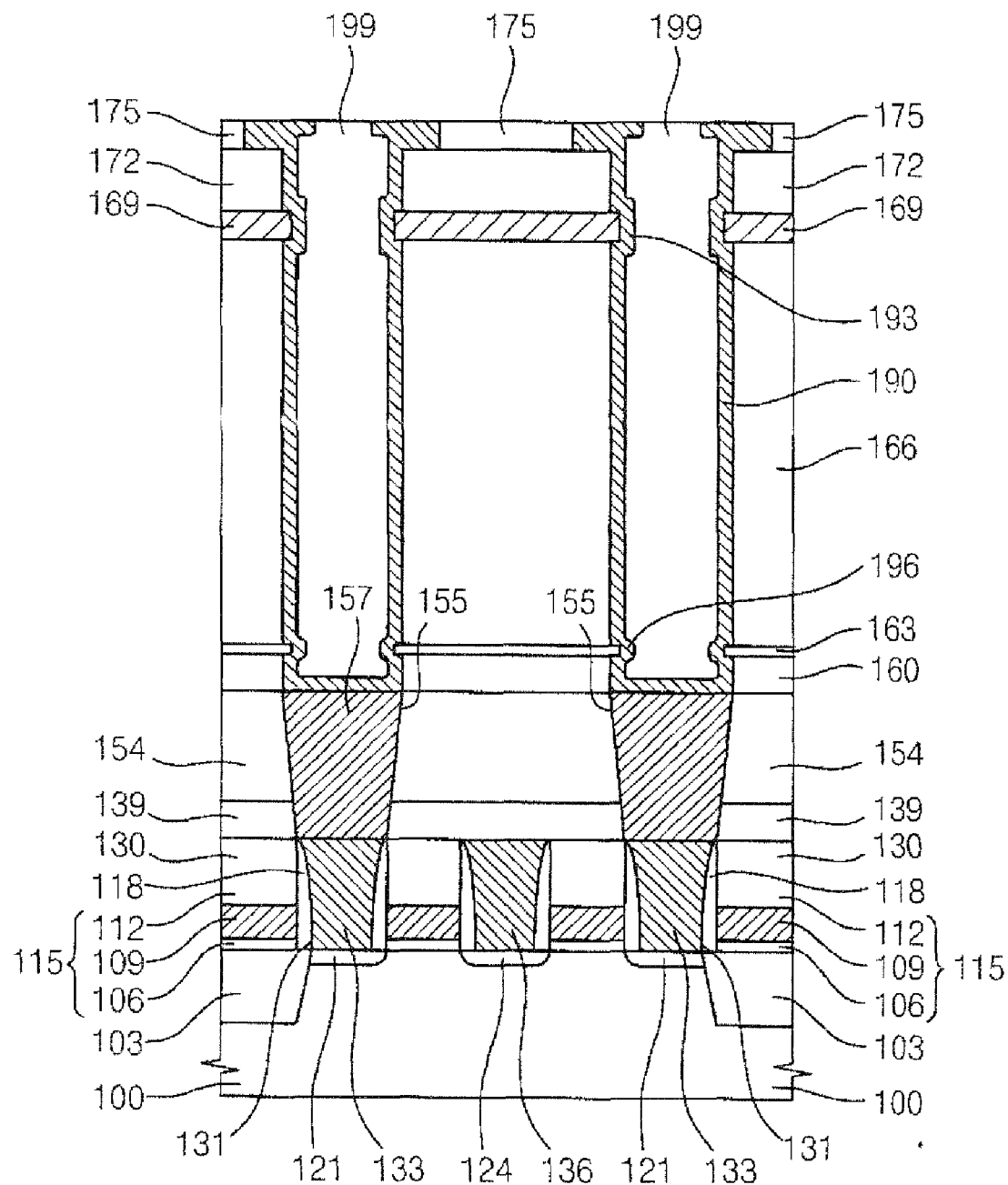
FIG. 18 is a cross sectional view taken along line VII-VII' in FIG. 17.
Figure 19:
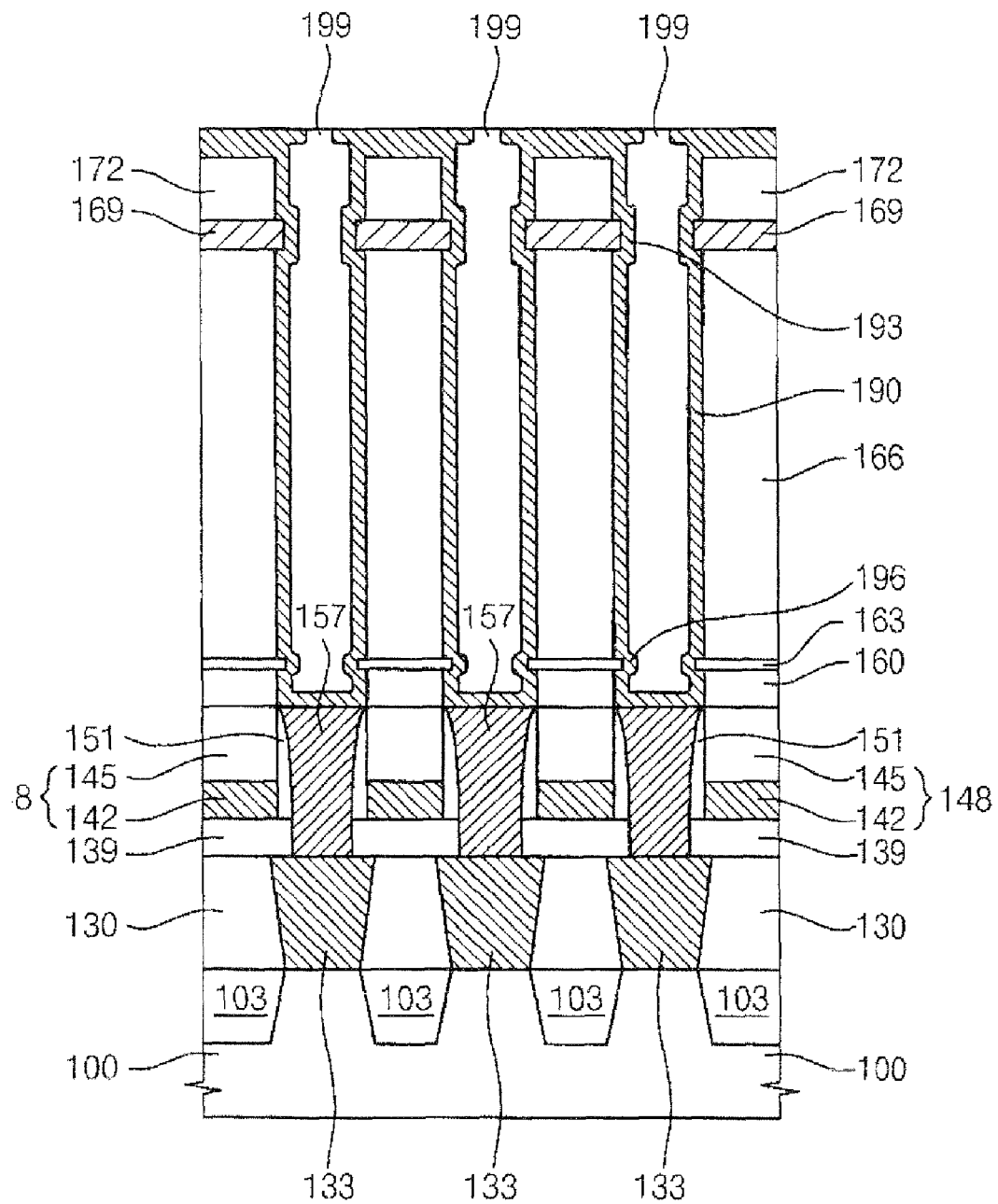
FIG. 19 is a cross sectional view taken along line VIII-VIII' in FIG. 17.

FIG. 17 is a plan view illustrating the removal of a storage node mask, FIG. 18 is a cross sectional view taken along line VII-VII' in FIG. 17 and FIG. 19 is a cross sectional view taken along line VIII-VIII' in FIG. 17.

Referring to FIGS. 17 to 19, a sacrificial layer 199 is formed on the conductive layer 190 to fill up the second openings 187. The storage node mask 181 is removed by a planarization process such as an etch-back process or a CMP process. The planarization process is carried out until the fourth mold layer 175 and a portion of the conductive layer 190 in the fourth region 187*d* of the second openings 187 are exposed. Examples of a material for the sacrificial layer 199 may include TEOS, HDP-CVD oxide, PSG, USG, BPSG, SOG, etc. These may be used alone or in a combination thereof. Preferably, the sacrificial layer 199 includes a material substantially identical that of the first and third mold layers 166 and 172. The sacrificial layer 199 protects the storage electrode 212 in changing the conductive layer 190 into the storage electrodes 212.

Figure 20:
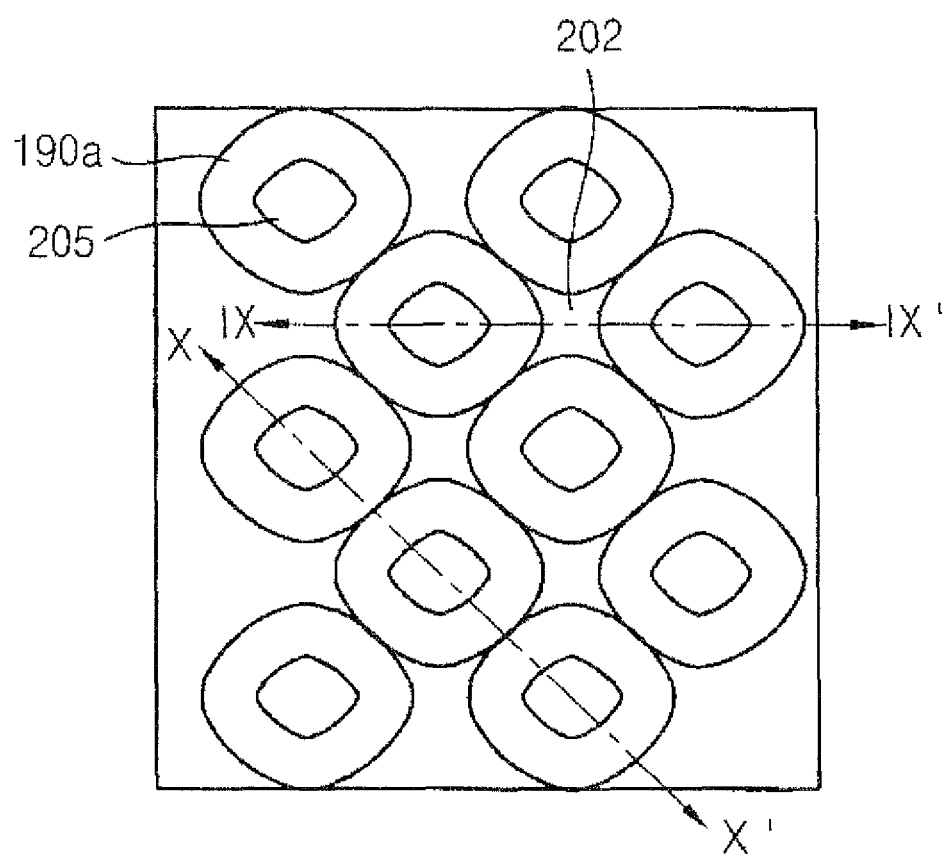
FIG. 20 is a plan view illustrating a step for forming a third opening and a stabilizing member.
Figure 21:
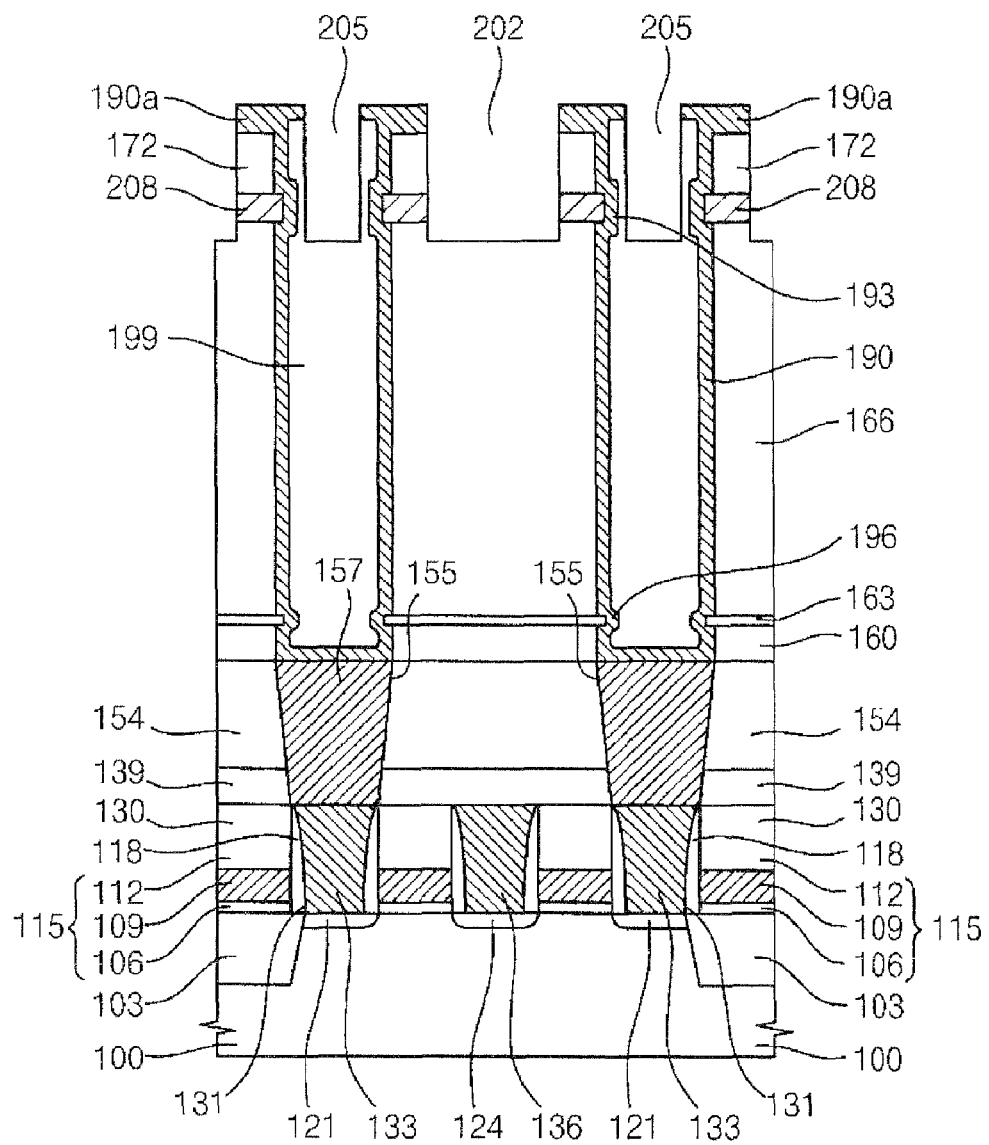
FIG. 21 a cross sectional view taken along line IX-IX' in FIG. 20.
Figure 22:
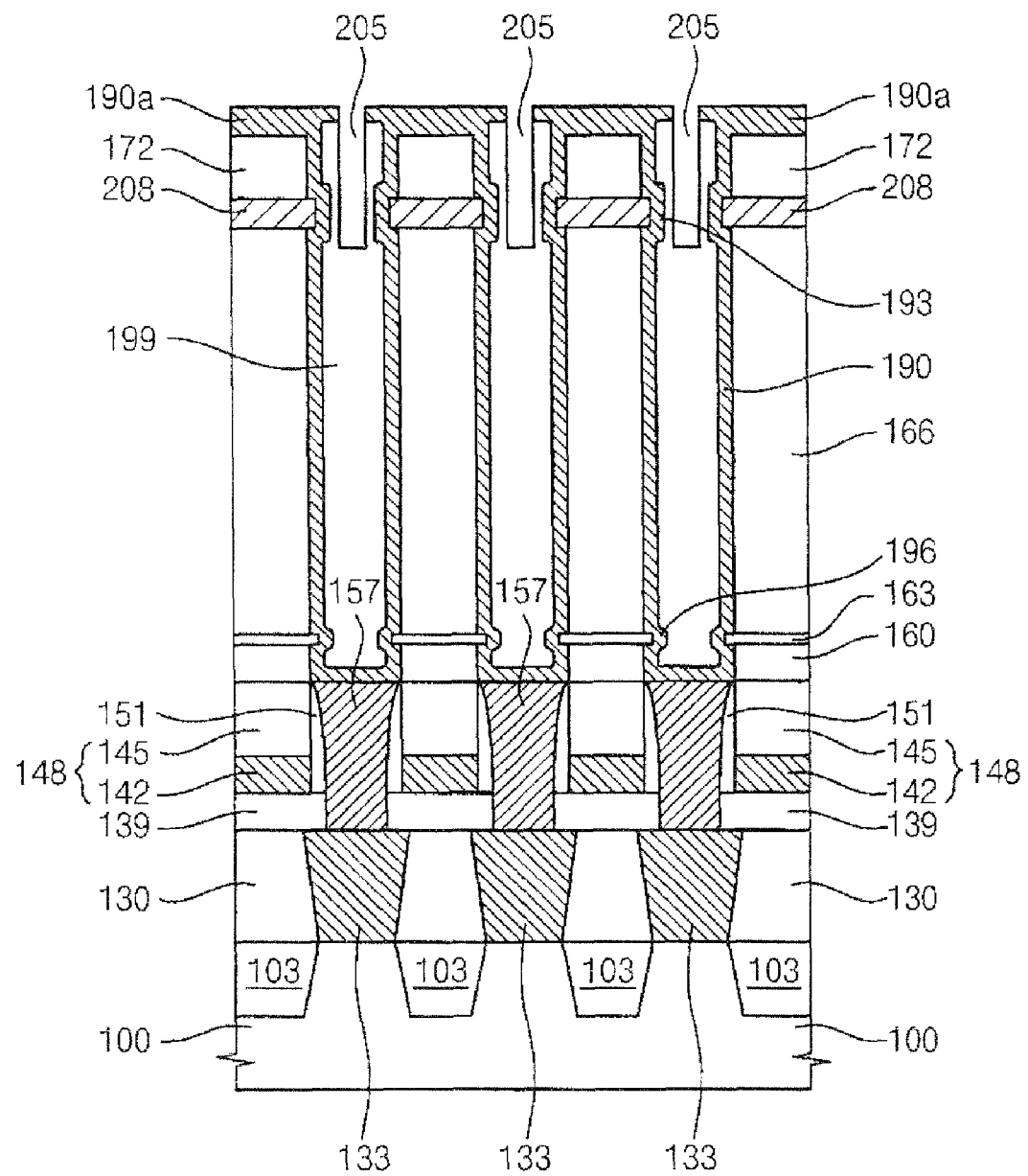
FIG. 22 is a cross sectional view taken along line X-X' in FIG. 20.

FIG. 20 is a plan view illustrating a step for forming a third opening and a stabilizing member, FIG. 21 a cross sectional view taken along line IX-IX' in FIG. 20 and FIG. 22 is a cross sectional view taken along line X-X' in FIG. 20.

Referring to FIGS. 20 to 22, third openings 202 exposing the first mold layer 166 is formed by an anisotropic etching process using an upper portion 190*a* of the conductive layer 190, which is exposed by the planarization process for removing the storage node mask 181, as an etching mask. Here, the fourth mold layer 175 is entirely removed and the second and third mold layers 169 and 172 are partially is removed. Simultaneously, the sacrificial layer 199 in the second openings 187 is partially removed to form fourth openings 205. Particularly, the anisotropic etching process for forming the third openings 202 is performed until the etching stop layer 163, the conductive layer on the inner sides of the second openings 187 and the first mold layer 166 defined by the second mold layer 169 are exposed. Alternatively, the first mold layer 166 may be over-etched in the anisotropic etching process for forming the third openings 202.

Also, the second mold layer 169 is partially removed in the anisotropic etching process for forming the third openings 202 to form the ring-shaped stabilizing member 208 that encloses the conductive layer 190 in the inside of the second openings 187.

Figure 26:
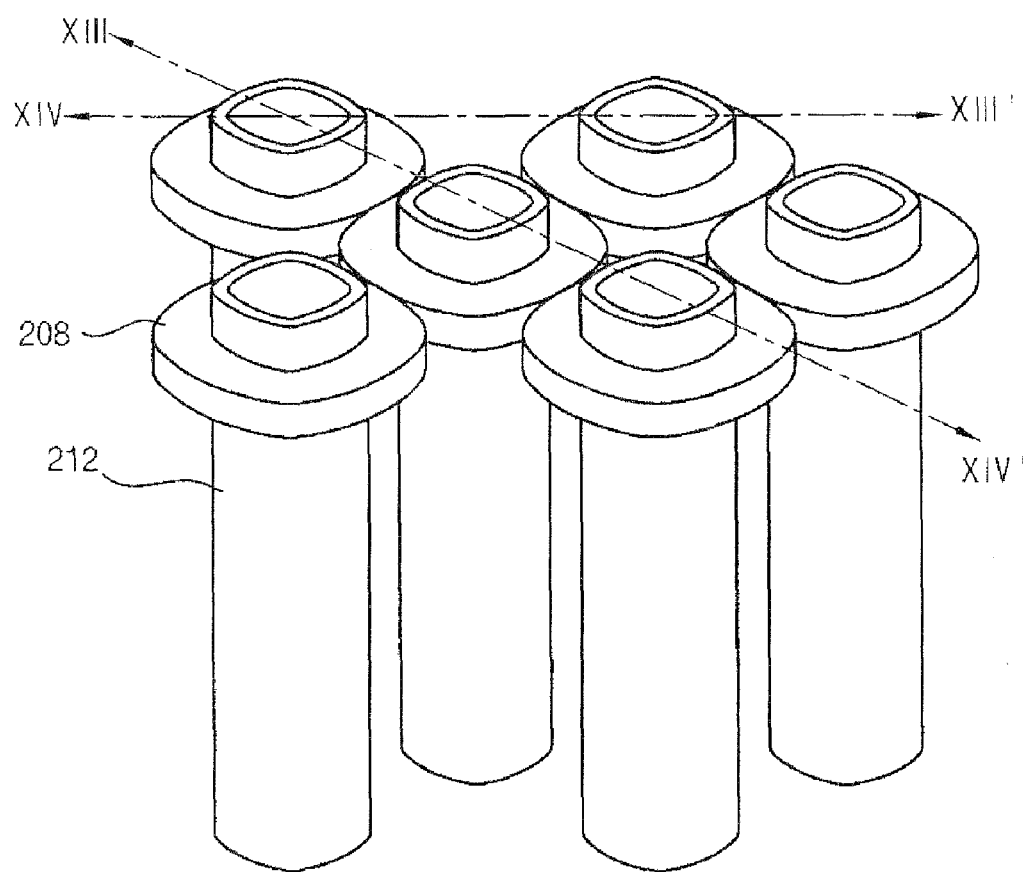
FIG. 26 is a perspective view illustrating the storage electrode and the stabilizing member.
Figure 27:
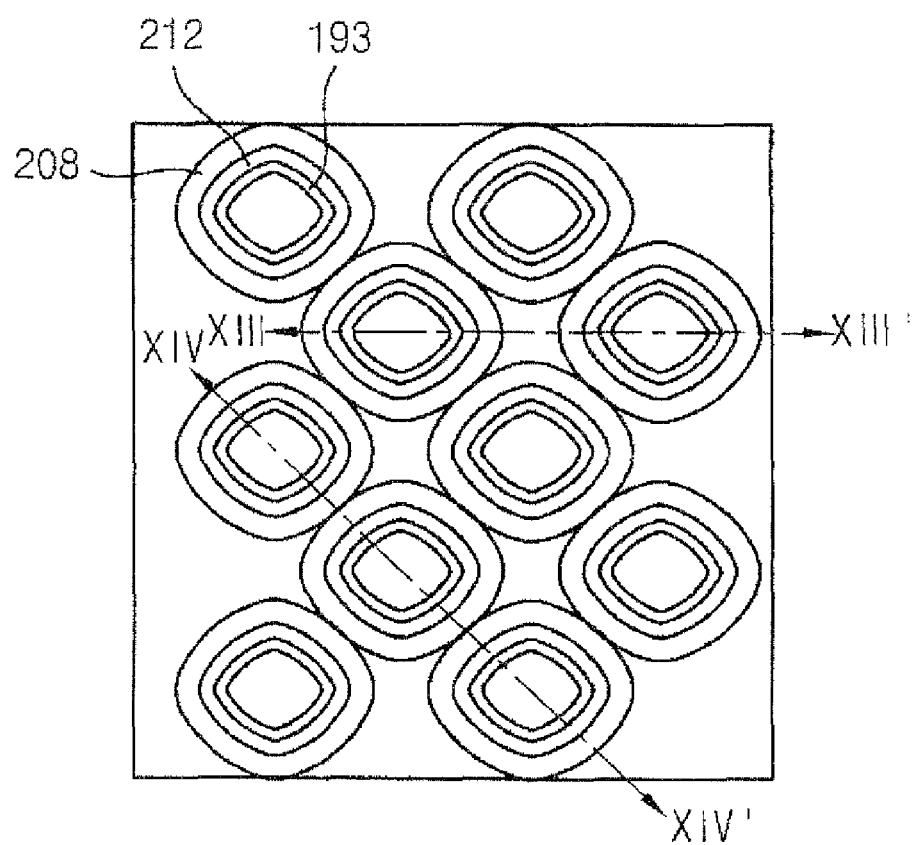
FIG. 27 is a plan view illustrating the storage electrode and the stabilizing member in FIG. 26.
Figure 28:
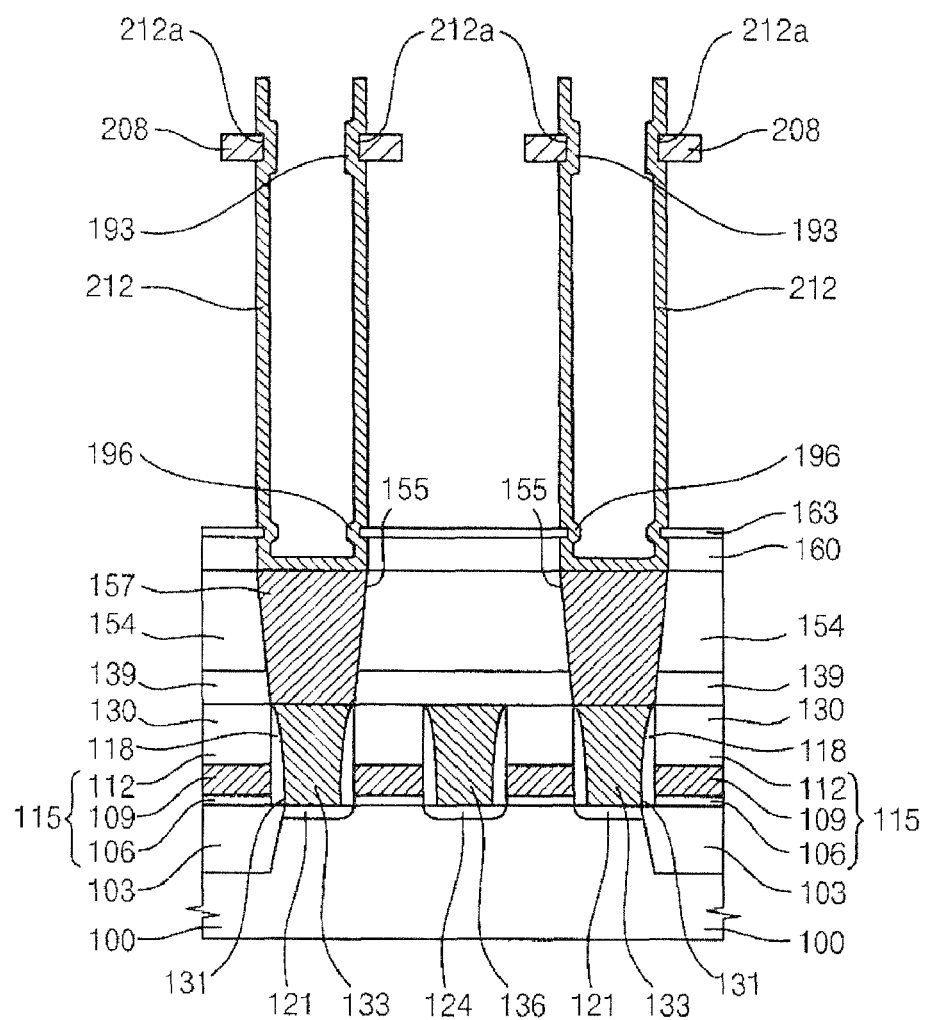
FIG. 28 is a cross sectional view taken along line XIII-XIII' in FIG. 27.
Figure 29:
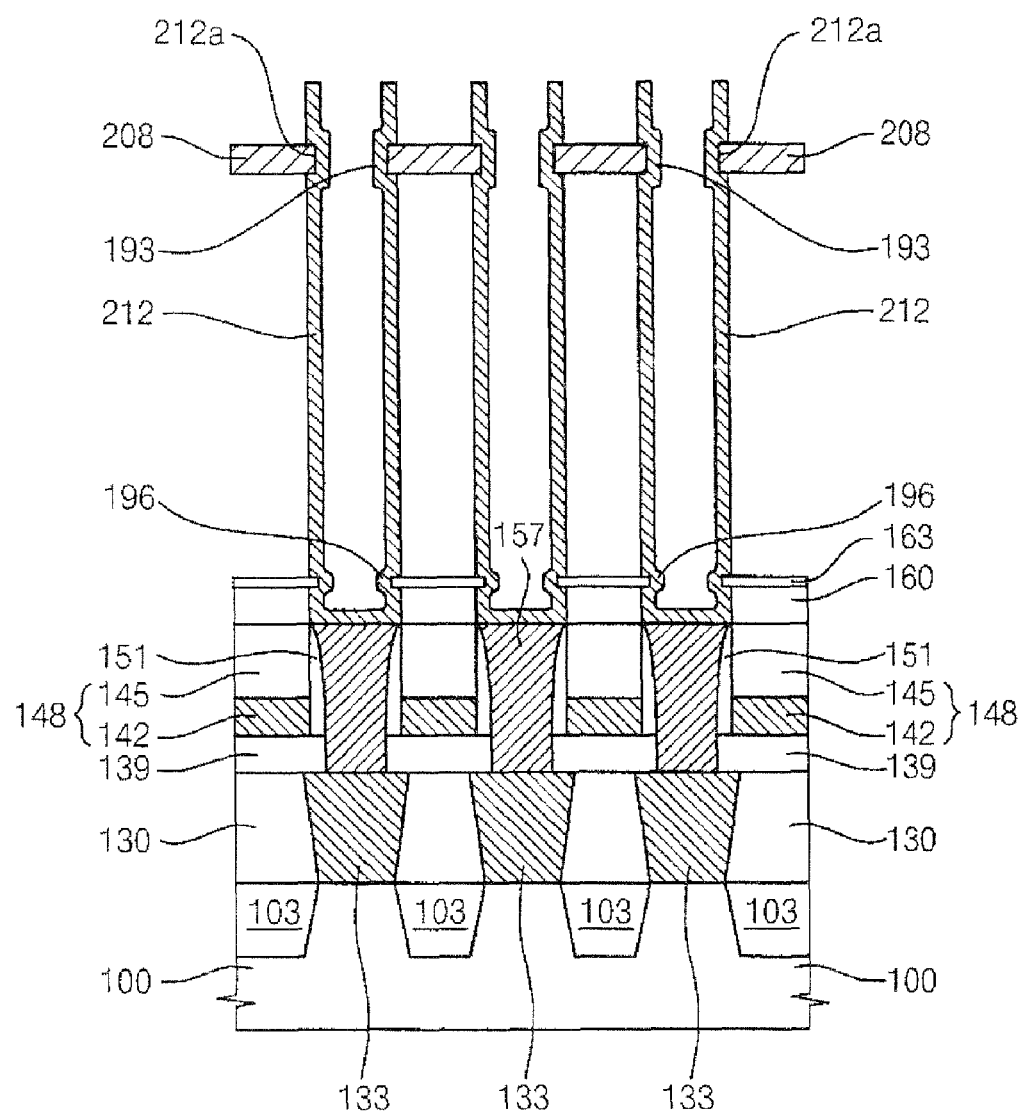
FIG. 29 is a cross sectional view taken along line XIV-XIV' in FIG. 27.

FIG. 26 is a perspective view illustrating the storage electrode and the stabilizing member, FIG. 27 is a plan view illustrating the storage electrode and the stabilizing member in FIG. 26, FIG. 28 is a cross sectional view taken along line XIII-XIII' in FIG. 27 and FIG. 29 is a cross sectional view taken along line XIV-XIV' in FIG. 27.

Referring to FIGS. 26 to 29, the first mold layer 166 and the third mold layer 172 is removed by an isotropic etching process. The isotropic etching process may include a wet etching process using an etching solution or a chemical dry etching (CDE) process using an etching gas. Examples of an etching solution used in the wet etching process include a solution including hydrogen fluoride, a solution including ammonium hydroxide, hydrogen peroxide and deionized water, a LAL solution including ammonium fluoride, hydrogen fluoride and distilled water, etc. These may be used alone or in a combination thereof. Examples of an etching gas used in the dry etching process are a gas including hydrogen fluoride, a gas including tetra-fluoro carbon (CH4) and oxygen, etc. These may be used alone or in a combination thereof.

Alternatively, a surface portion of the stabilizing member 208 may be removed together in removing the first mold layer 166. Thus, to prevent the stabilizing member 208 from being removed by the etching solution or the etching gas in removing the first mold layer 166, the stabilizing member has preferably a high etching selectivity with respect to the first mold layer 166 and has also a sufficient thickness. Here, the thickness of the stabilizing member 208 may be determined in accordance with the etching selectivity between the first mold layer 166 and the stabilizing member 208.

The storage electrode 212 and the stabilizing member 208 formed by the above-mentioned processes are illustrated in detail with reference to FIGS. 26 to 29.

The storage electrode 212 is formed on the fourth pad 157 in the contact region. The storage electrode 212 has a cylindrical shape having an opened upper end. The stabilizing member 208 has a ring shape enclosing an upper portion of the storage electrode 212. The stabilizing member 208 supports the storage electrode 212 and an adjacent storage electrode 212 so that the storage electrode 212 may have an improved structural stability.

Also, some stabilizing members 208 enclosing the storage electrodes 212 that are arranged in the first direction are spaced apart from each other, and other stabilizing members 208 enclosing the storage electrodes 212 that are arranged in the second direction are connected to each other.

Further, an annular groove 212a for receiving the stabilizing member 208 is formed on an outer upper side of the storage electrode 212. A first annular protrusion 193 corresponding to the annular groove 212a is formed on an inner upper side of the storage electrode 212. A second annular protrusion 196 is formed on an outer lower side of the storage electrode 212 by the etching stop layer 163.

Here, the storage electrode 212 has a substantially uniform thickness. The stabilizing member 208 extends from an inner side of the annular groove 212a to the adjacent storage electrode 212 in a direction substantially perpendicular to the storage electrode 212.

As a result, the stabilizing member provides the structural stability to the upper portion of the storage electrode 212. Also, the second annular protrusion 196 provides the structural stability to the lower portion of the storage electrode 212.

Figure 30:
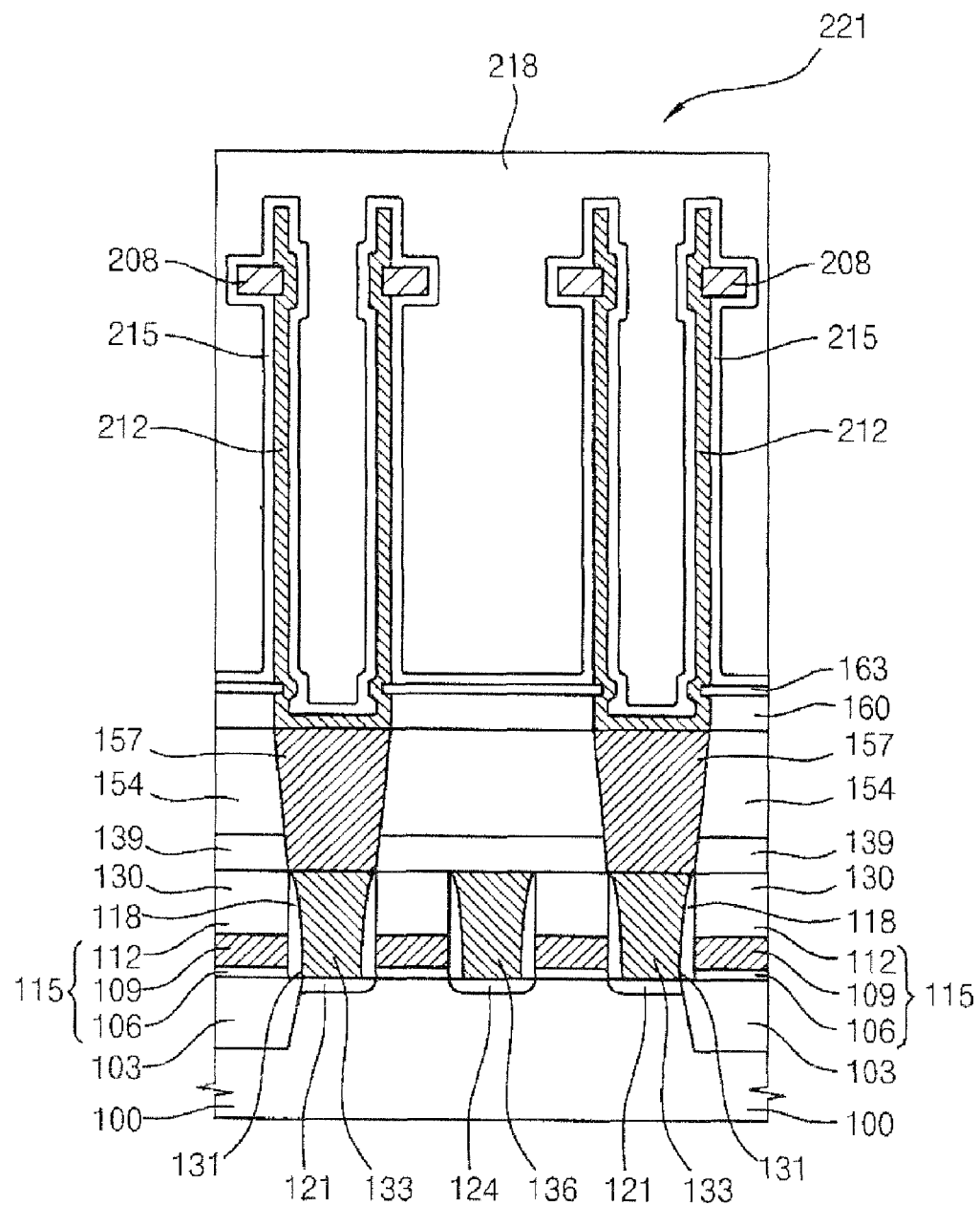
FIGS. 30 and 31 are cross sectional views illustrating steps for completing a capacitor on the substrate.
Figure 31:
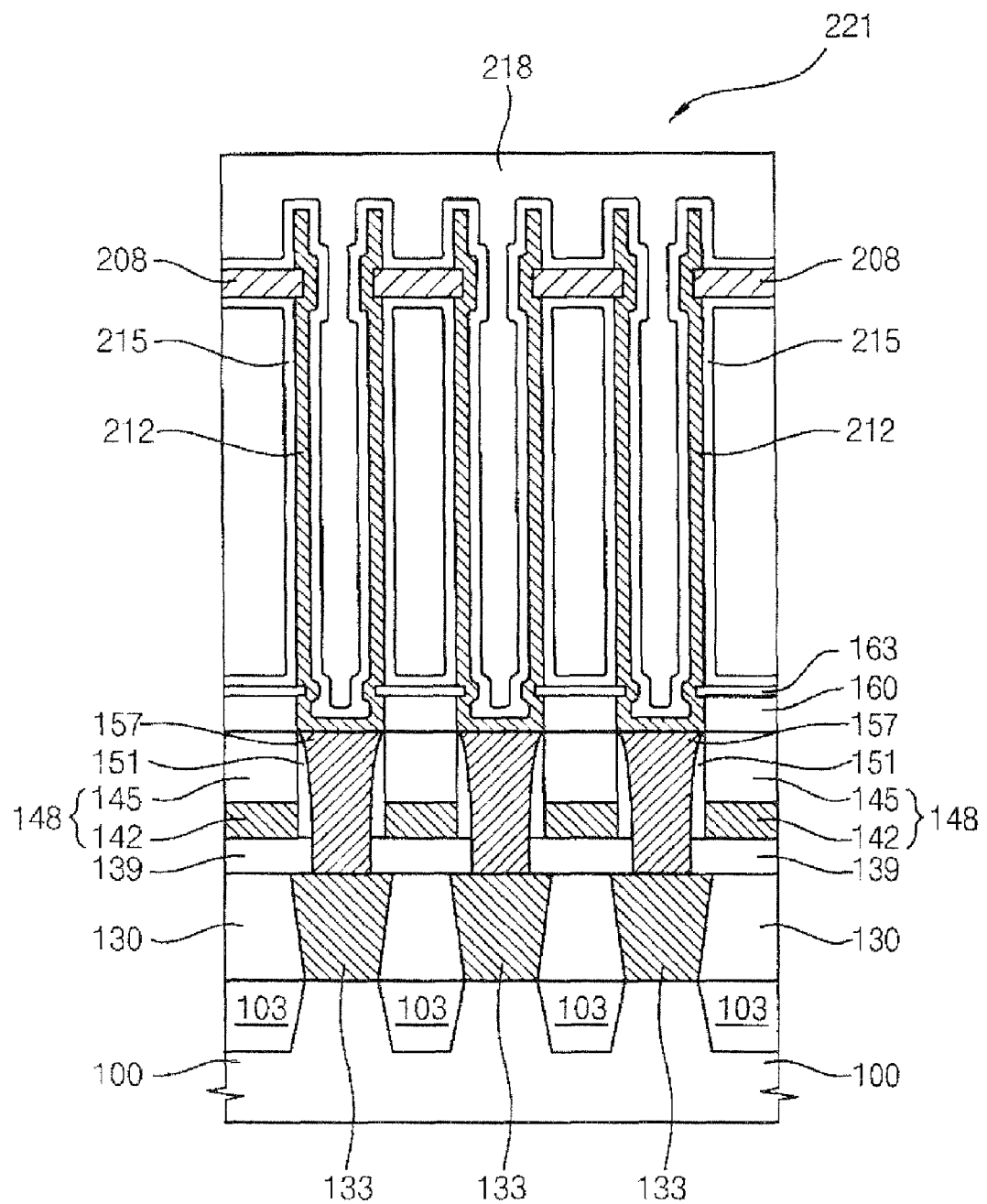

FIGS. 30 and 31 are cross sectional views illustrating steps for completing a capacitor on the substrate.

Referring to FIGS. 30 and 31, a dielectric layer 215 and a plate electrode 218 are sequentially formed on the storage electrode 212 connected to each other by the stabilizing member 208 to complete the capacitor 221. The dielectric layer 215 and the plate electrode 218 are formed on surfaces of the storage electrode 212 and the stabilizing member 208. Here, some capacitors 221 arranged in the first direction are spaced apart from each other. On the contrary, other capacitors 221 arranged in the second direction are connected to each other through the stabilizing member 208. Therefore, although the capacitors 221 have high aspect ratios, the capacitors 221 may not fall down.

Additionally, a fifth insulating interlayer (not shown) is formed on the capacitors 221 to electrically isolate the capacitors 221 with an upper wiring (not shown). The upper wiring is then formed on the fifth insulating interlayer to complete a semiconductor device.

According to the invention, the storage electrodes are connected to each other via the stabilizing member. Particularly, some storage electrodes arranged in the first direction are spaced apart from each other, and other storage electrodes arranged in the second direction are connected to each other. Therefore, the two-bit fail may be avoided although the capacitor has a high aspect ratio. Also, the capacitor may have improved structural stability without the capacitors falling down.

Having described exemplary embodiments of the invention, it is noted that modifications and variations can be made by persons skilled in the art in light of the above teachings. Therefore, it is to be understood that changes may be made to embodiments of the invention disclosed that are nevertheless still within the scope and the spirit of the invention as defined by the appended claims.

What is claimed is:

1. A capacitor comprising:
    a plurality of cylindrical storage electrodes formed on a substrate;
    a plurality of ring-shaped stabilizing members, each ring-shaped stabilizing member enclosing one of the storage electrodes to structurally support the storage electrodes, the stabilizing members being substantially perpendicular to the storage electrodes and extending to adjacent storage electrodes;
    a dielectric layer formed on the storage electrodes; and
    a plate electrode formed on the dielectric layer,
    wherein each stabilizing member is spaced apart from an adjacent stabilizing member in a first direction and is not connected to the adjacent stabilizing member in the first direction and the stabilizing member is directly connected to another adjacent stabilizing member along a slant direction relative to the first direction,
    wherein an annular groove for receiving the stabilizing member is formed at an upper outer face of each of the storage electrodes, and
    wherein a lower annular groove is formed at a lower outer surface of each of the storage electrodes.

2. The capacitor of claim 1, wherein the storage electrodes have a substantially uniform thickness.

3. The capacitor of claim 1, wherein an annular protrusion corresponding to the annular groove is formed at an upper inner face of the storage electrodes.

4. The capacitor of claim 1, wherein the stabilizing member extends from an inner face of the annular groove.

5. The capacitor of claim 1, wherein an annular protrusion corresponding to the lower annular groove is formed at a lower inner face of the storage electrodes.

* * * * *